(12) United States Patent
Fortin et al.

(10) Patent No.: US 7,799,376 B2
(45) Date of Patent: Sep. 21, 2010

(54) METHOD OF CONTROLLING FILM STRESS IN MEMS DEVICES

(75) Inventors: Vincent Fortin, Bromont (CA); Luc Ouellet, Granby (CA)

(73) Assignee: DALSA Semiconductor Inc., Waterloo, Ontario (CA)

( * ) Notice: Subject to any disclaimer, the term of this patent is extended or adjusted under 35 U.S.C. 154(b) by 492 days.

(21) Appl. No.: 11/829,646

(22) Filed: Jul. 27, 2007

(65) Prior Publication Data

US 2009/0029533 A1    Jan. 29, 2009

(51) Int. Cl.
C23C 16/24 (2006.01)
(52) U.S. Cl. .............. 427/255.23; 427/255.28; 427/294; 427/376.1
(58) Field of Classification Search .......... 427/248.1, 427/255.29, 294, 376.1, 255.23, 255.28; 438/482
See application file for complete search history.

(56) References Cited

U.S. PATENT DOCUMENTS

| 4,569,121 | A | * | 2/1986 | Lim et al. ............... 438/467 |
| 4,717,681 | A | * | 1/1988 | Curran ..................... 438/314 |
| 5,576,059 | A | * | 11/1996 | Beinglass et al. ...... 427/255.18 |
| 6,635,509 | B1 | * | 10/2003 | Ouellet .................. 438/106 |
| 6,716,476 | B2 | * | 4/2004 | Ouellet et al. ............. 427/8 |
| 6,737,307 | B2 | * | 5/2004 | Tsai et al. ............... 438/166 |
| 6,821,825 | B2 | * | 11/2004 | Todd et al. ............... 438/150 |
| 7,431,968 | B1 | * | 10/2008 | Shtein et al. ........... 427/255.6 |
| 2005/0233492 | A1 | * | 10/2005 | Ouellet et al. ............ 438/50 |
| 2006/0110895 | A1 | * | 5/2006 | Ouellet et al. ........... 438/482 |

FOREIGN PATENT DOCUMENTS

EP    1452481 A2  *  9/2004

OTHER PUBLICATIONS

Ylonen, Mari, et al., "In situ boron-doped LPCVD polysilicon with low tensile stress for MEMS applications". Sensors and Actuators A 109 (2003) pp. 79-87.*

Luoto, H., et al., "Low-temperature bonding of thick-film polysilicon for microelectromechanical system (MEMS)". Microsyst Technol (2006) 12: pp. 401-405.*

* cited by examiner

*Primary Examiner*—Bret Chen
(74) *Attorney, Agent, or Firm*—Marks & Clerk; Richard J. Mitchell

(57) ABSTRACT

A structural film, typically of silicon, in MEMS or NEMS devices is fabricated by depositing the film in the presence of a gas other than nitrogen, and preferably argon as the carrier gas.

9 Claims, 27 Drawing Sheets

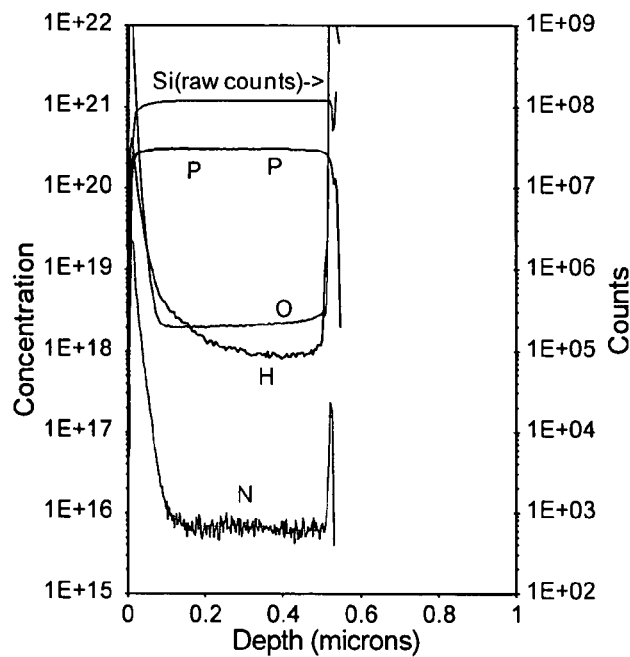
Fig. 12a
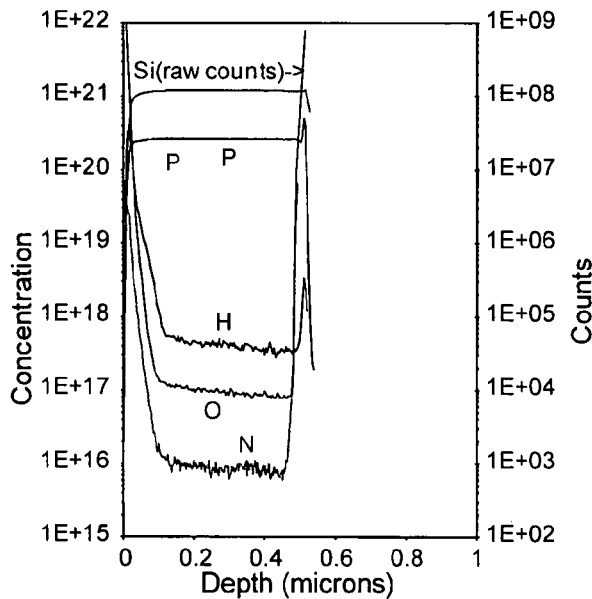
Fig. 12b
| Element | Concentration (%) As-deposited film | Concentration (%) Annealed film |
|---|---|---|
| P | 0.6% | 0.6% |
| O | 0.004 – 0.006% | 0.0002% |
| H | 0.02 – 0.002% | 0.001% |
| N | 0.00002% | 0.00002% |
Fig. 13

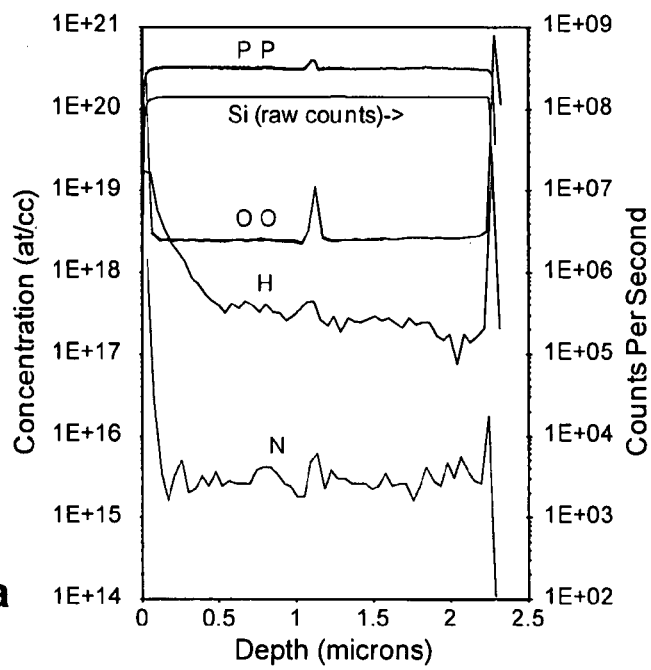
Fig. 14a
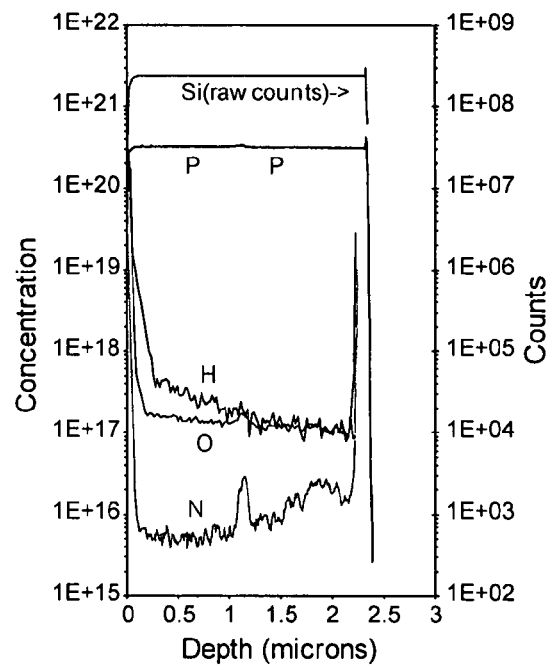
Fig. 14b
| Element | Concentration (%) As-deposited film | Concentration (%) Annealed film |
| --- | --- | --- |
| P | 0.6% | 0.6% |
| O | 0.006% | 0.002 – 0.0004% |
| H | 0.04 – 0.0008% | 0.0002 – 0.0008% |
| N | 0.00006% | 0.00006% |
Fig. 15

| Element | $N_2$ carrier gas for $PH_3$ | | Ar carrier gas for $PH_3$ | |
|---|---|---|---|---|
| | As-deposited | Annealed | As-deposited | Annealed |
| P | 0.6% | 0.6% | 0.16 – 0.04% | 0.06% |
| O | 0.006% | 0.00018% | 0.006 – 0.008% | 0.0004% |
| H | 0.04 – 0.0006% | 0.002 – 0.0004% | 0.06 – 0.008% | 0.016 – 0.0005% |
| N | 0.000018% | 0.000006% | 0.00001% | 0.00002% |
| C | 0.00016% | 0.00018% | 0.0002% | 0.0002% |

METHOD OF CONTROLLING FILM STRESS IN MEMS DEVICES

FIELD OF THE INVENTION

This invention relates to the manufacture of Micro Electromechanical Systems (MEMS) or NEMS (Nano Electromechanical Systems) devices, and in particular to a method of controlling film stress in the manufacture of such devices, and in particular silicon film stress.

BACKGROUND OF THE INVENTION

The manufacture of Micro-Electro-Mechanical Systems (MEMS) such as micro-gyroscopes, micro-accelerometers, RF micro-resonators, micro-mirrors, micro-motors, micro-actuators and other such micro-devices integrating very sensitive moving mechanical parts poses some very serious challenges because they must meet a number of stringent requirements. Specifically:

i. These very sensitive mechanical parts are typically made of silicon, (polysilicon or silicon-germanium).

ii. Such mechanical parts need to display either low or specific stress values and low or specific stress gradient properties which is typically achieved during a stress/stress-gradient relief step during a high temperature annealing process.

iii. The mechanical parts need to present a good electrical conductivity.

iv. The mechanical parts need to be integrated with other permanent and/or temporary (sacrificial) materials.

v. The integration of all the materials together may cause some detrimental interactions due to the thermal budget and the subsequent annealing steps that could thus affect the layers previously deposited/annealed and therefore modify the film stress and stress gradient values along the processing of the devices.

vi. It may also be required to combine annealed with non-annealed structures or to combine doped with undoped layers in order to achieve the desired stress values which in turn increases the manufacturing costs and/or complexity.

A method for manufacturing wafers should permit the accurate control of the mechanical stress and stress gradient as well as the uniformities (within-wafer and wafer-to-wafer) of those film properties. In such a case, having the ability to in-situ control and to achieve the desired and targeted stress or stress gradient to obtain the final device properties required is an object of this invention.

Various attempts have been made to control stress in the prior art. Some of those attempts are described below.

Si-Based Layers for Device Manufacturing

CWRU's Multipoly Process

Case Western Reserve University (Yang et al.) developed an impressive 9-layer MultiPoly film with a stress <10 MPa. However, such film is not conductive and displays a 2 µm deflection over a 310-µm long beam. In addition to the stress gradient or resistivity issues displayed by the CWRU's MultiPoly film, such layers display a high roughness of 16 nm even for quasi-amorphous films as presented in FIG. 1. Despite the high potential of such a deposition method, this film presents severe drawbacks due to the stress gradient and the film resistivity. In addition, this material developed by Case Western Reserve University does not allow one to deposit a film with the exact stress level desired.

IMEC's PECVD Poly-SiGe films

Rusu et al. from the IMEC showed some promising results with doped PECVD Poly-SiGe films as they were able to achieve low stress (<20 MPa) films at a deposition temperature as low as 400° C. and annealed at temperature from 450 to 520° C. However, in that case they only achieved film resistivities ranging from ~10 to ~100 Ω-cm as presented in FIG. 2. In order to achieve a resistivity between 1 mΩ-cm and 10 mΩ-cm, the annealing temperature needs to be increased up to 600° C. which then, in turn, affects the film stress and brings it up above 300 MPa as shown in FIG. 2 and FIG. 3.

In addition to the stress or resistivity issues displayed by the IMEC's Poly-SiGe film, such layers display a moderately high roughness of 9.2 nm even for quasi-amorphous films as presented in FIG. 4.

Nevertheless, this film does not provide one a good control of the stress.

Impact of $AsH_3$ Doping on In-Situ Doped Amorphous Si Film Properties

It has been proposed by Ouellet et al. that using $AsH_3$ in conjunction with $PH_3$ would lead to a near-zero stress film. This method has the advantages of using the physical size of the P and As atoms as interstitial atoms to control the film stress. Although depositing a film in-situ doped with As and P leads to a low-stress layer, it does not allow one to easily select the desired stress. On the other hand, another invention from Ouellet et al. demonstrates the possibility to vary the stress by using a combination of phosphorus-doped and undoped Si films to achieve the desired stress. In this case however, the film resistivity would not be uniform throughout the entire thickness of the film therefore requiring an annealing step which would then annihilate the impact of the multilayer process and would thus lead to an undesired stress value.

Impurities in Deposited Film

Oxygen and Other Impurity Concentration at Low Deposition Temperatures

Green et al. clearly identified that the deposition temperatures have a significant impact on the concentration of oxygen in the Si films. They also identified that using the $SiH_4$ precursor had a smaller impact on this oxygen incorporation as shown in FIG. 5. The results presented in this figure clearly demonstrate that the higher the deposition temperature, the lower the oxygen concentration in the Si film. This statement is true independently of the Si precursor used.

Impact of Gas Purifiers on Gas Impurities

It has been shown by Hsu et al. that the concentration of impurities can be significantly reduced by adding gas purifiers on the gas lines of an epitaxial Si growth chamber. As a matter of fact dual-layer films ($1^{st}$ half with and $2^{nd}$ half without gas purifiers) showed a significant decrease of the oxygen, hydrogen and carbon concentration. For example, the oxygen concentration goes from 4E19at./cm$^3$ to 3E18at./cm$^3$ after using the gas purifiers on the gases used in the chamber for an epitaxial Si grown at a temperature of 305° C. as shown in FIG. 6.

Further details of the prior art processes can be found in the following references, which are herein incorporated by reference:

i. M. L. Green, D. Brasen, M. Geva, W. Reents Jr., F. Stevie and H. Temkin, *Oxygen and carbon incorporation in low temperature epitaxial Si films grown by rapid thermal chemical vapor deposition (RTCVD)*, Journal of Electronic Materials, Vol. 19, No. 10, 1990, pp. 1015-1019.

ii. T. Hsu, B. Anthony, L. Breaux, R. Qian, S. Banerjee, A. Tasch, C. Magee and W. Harrington, *Defect microstructure in single crystal silicon thin films grown at 150° C.-305° C. by remote plasma-enhanced chemical vapor deposition*, Journal of Electronic Materials, Vol. 19, No. 10, 1990, pp. 1043-1050.

iii. J. Yang, H. Kahn, A.-Q. He, S. M. Philips, A. H. Heuer, *A new technique for producing large-area as-deposited zero-stress LPCVD polysilicon films: The MultiPoly Process*, IEEE Journal of Microelectromechanical Systems, Vol. 9, No. 4, December 2000, 485-494.

iv. C. Rusu, S. Sedky, B. Parmentier, A. Verbist, O. Richard, B. Brijs, L. Geenen, A. Witvrouw, F. Larmer, F. Fischer, S. Kronmuller, V. Leca and B. Otter, *New low-stress PECVD Poly-SiGe layers for MEMS*, Journal of microelectromechanical systems, Vol. 12, No. 6, December 2003, pp. 816-825.

v. Luc Ouellet and Robert Antaki, *Method of fabricating silicon-based MEMS devices*, U.S. Pat. No. 7,144,750, Dec. 5, 2006.

vi. Luc Ouellet and Robert Antaki, *Fabrication of advanced silicon-based MEMS devices*, U.S. Pat. No. 7,160,752 B2, Jan. 9, 2007.

SUMMARY OF THE INVENTION

The present invention adopts a novel approach that allows one to vary the mechanical stress obtained after annealing the deposited Si layer to be either tensile or compressive. Impressive mechanical stress uniformities are also demonstrated with this approach. Such a process therefore presents a tremendous advantage in terms of the potential for integration in various Micro-Electro-Mechanical Systems (MEMS) or Nano-Electro-Mechanical Systems (NEMS) as one can choose the nature of the mechanical stress itself as well as the desired stress in addition to adjusting the stress gradient to the required values.

According to one aspect of the invention there is provided a method of fabricating a structural film in MEMS or NEMS devices, comprising vapor depositing said film in the presence of a dopant precursor gas and a carrier gas; and selecting as said carrier gas an inert gas other than nitrogen.

It has been widely believed in the industry that the nitrogen ($N_2$) carrier gas used along with phosphine ($PH_3$) did not have any impact on the film properties of the in-situ doped poly-Si or in-situ doped amorphous Si. The present invention however clearly demonstrates that, contrary to prior art belief, changing this $N_2$ carrier gas, although believed to be inert in the LPCVD reaction taking place, by an Ar carrier gas drastically modifies the film properties and therefore, opens a whole window of new possibilities and potential for device fabrication.

According to another aspect of the invention there provided a method of fabricating a structural silicon film in MEMS or NEMS devices, comprising depositing said silicon film by LPCVD in the presence of a dopant precursor gas and argon as a carrier gas.

This invention results from a detailed understanding of the materials science relating to the impact of the annealing step on the Si film properties.

BRIEF DESCRIPTION OF THE DRAWINGS

The invention will now be described in more detail, by way of example only, with reference to the accompanying drawings, in which:—

FIG. 12 shows elemental profiles (SIMS) for (a) as-deposited and (b) annealed 0.5 µm in-situ P-doped amorphous Si films;

FIG. 13 shows elemental concentrations in 0.5 µm in-situ P-doped amorphous Si films;

FIG. 14 shows 2.5 µm in-situ P-doped amorphous Si films (a) as-deposited and (b) after an annealing process;

FIG. 15 shows elemental concentrations in 2.5 µm in-situ P-doped amorphous Si films;

DETAILED DESCRIPTION OF THE PREFERRED EMBODIMENTS

In order to assist the reader in understanding the invention, a detailed discussion of the underlying materials science will be undertaken.

Impact of a Si Film Anneal on Film Properties

Figure 1:
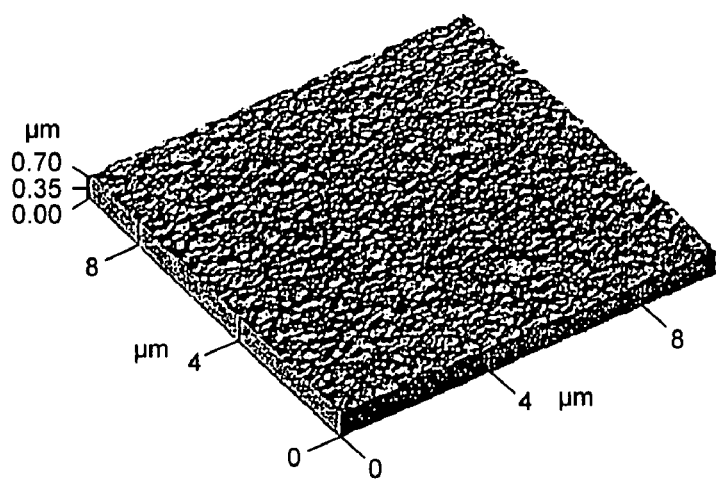
FIG. 1 consists of AFM images of CWRU's nine-layer MultiPoly film with a Rms roughness of 16 nm (ref. Yang et al.)
Figure 2:
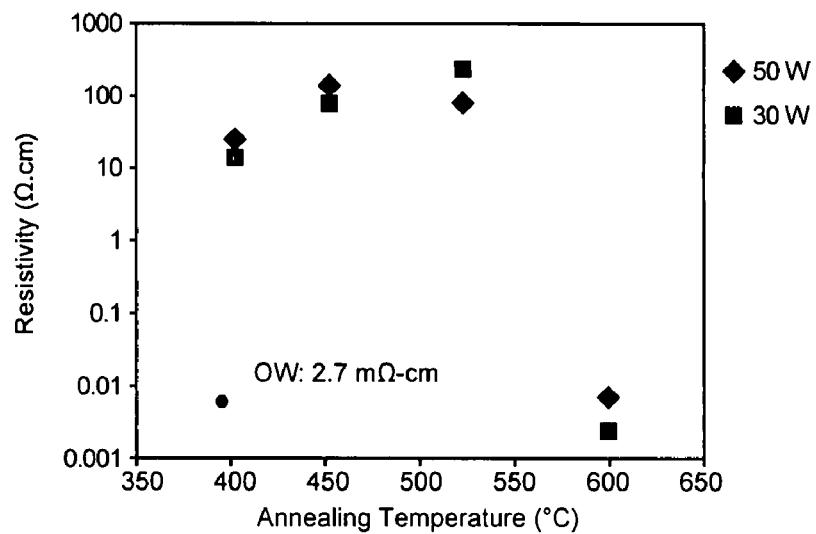
FIG. 2 illustrates the effect of annealing temperature and plasma power on resistivity on in-situ doped B—Si0.31Ge0.69 deposited at 400° C. (ref. Rusu et al.)
Figure 3:
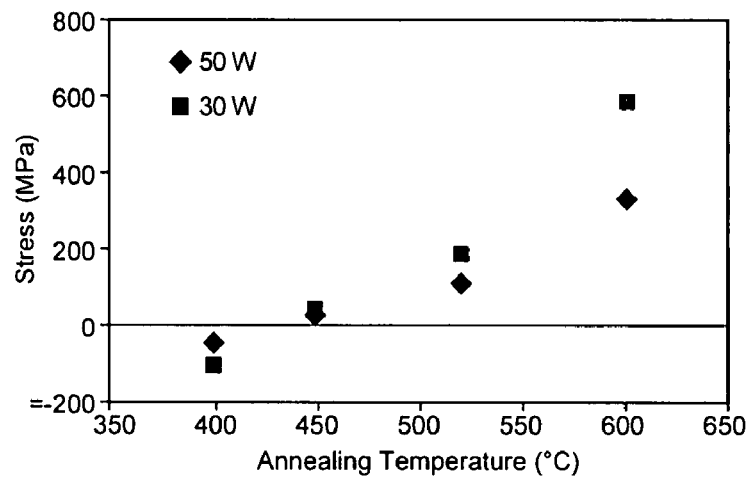
FIG. 3 shows the dependence of the stress of in-situ B-doped Si0.31Ge0.69 deposited at 400° C. on annealing temperature for plasma settings of 30 and 50 W (ref. Rusu et al.)
Figure 4A:
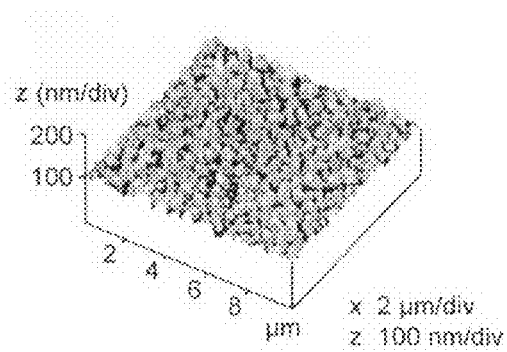
FIG. 4 consists of AFM images of 8.5 µm P-doped SiGe layer deposited at 550 C for a) a mostly amorphous film (demonstrating a Rms roughness=9.2 nm) and b) a Polycrystalline film (showing a Rms roughness=117 nm) (ref. Rusu et al.)
Figure 4B:
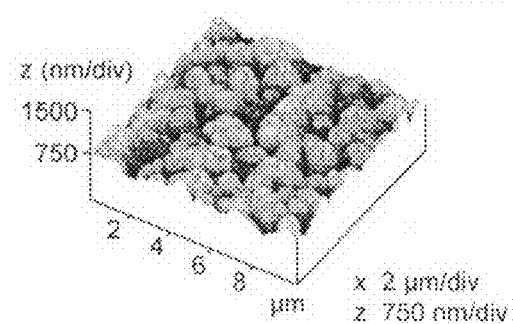
Figure 5:
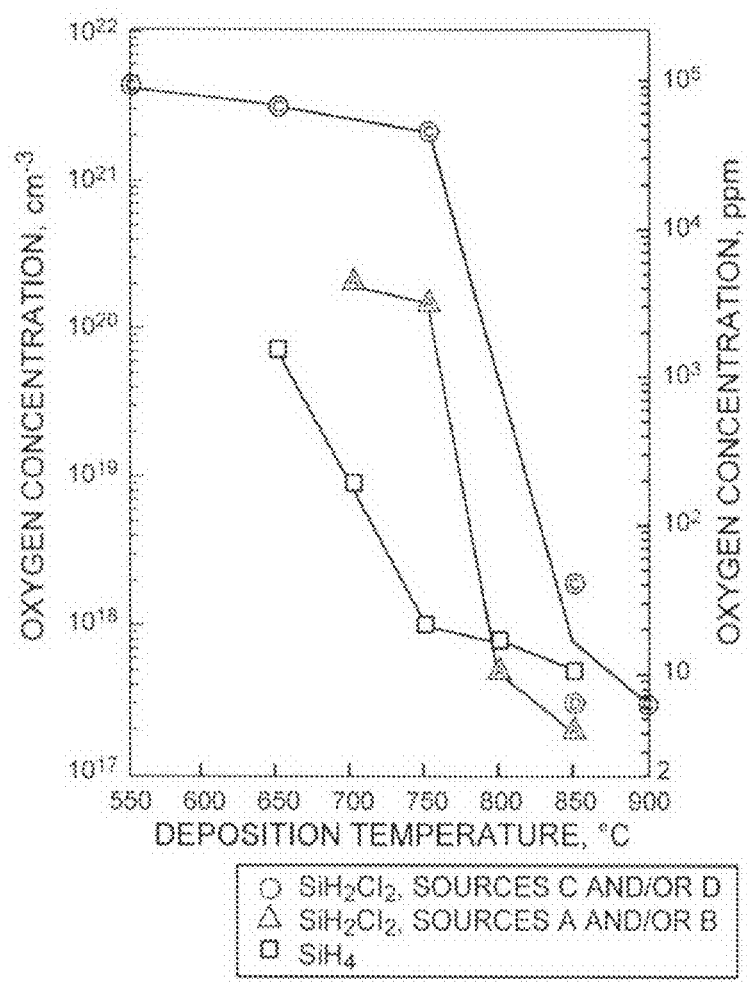
FIG. 5 shows oxygen concentration as a function of deposition temperature (ref. Green et al.)
Figure 6A:
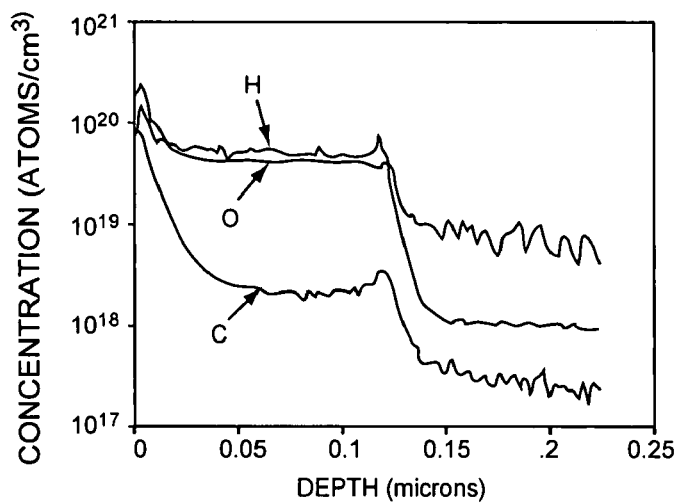
FIG. 6 is a SIMS analysis of the epitaxial Si films grown at a) 305° C., b) 220° C. and c) 150° C. by RPCVD (ref. Hsu et al.)
Figure 6B:
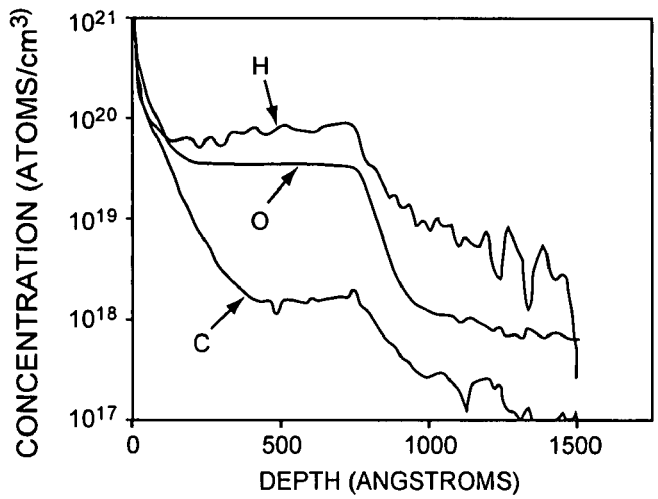
Figure 6C:
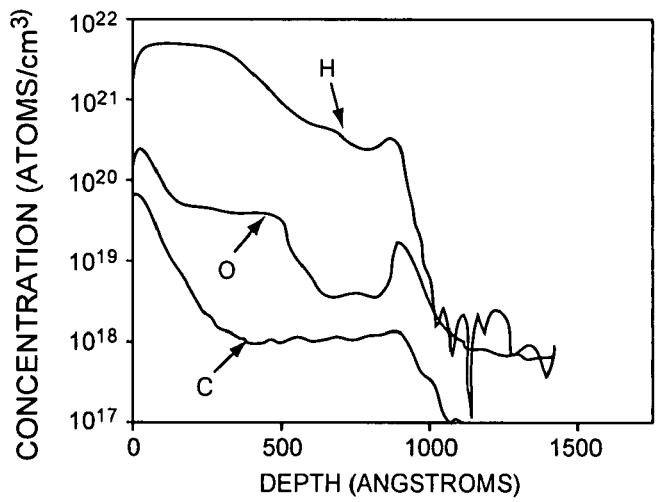
Figure 7:
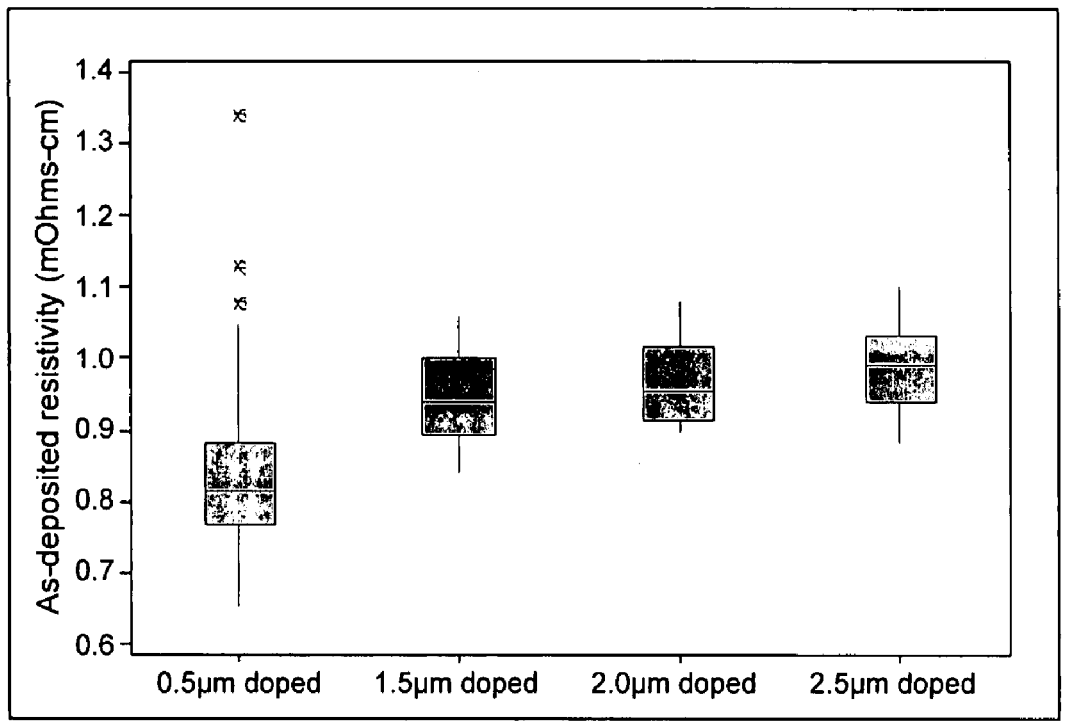
FIG. 7 shows as-deposited and post-annealed Si film resistivity.
Figure 7:
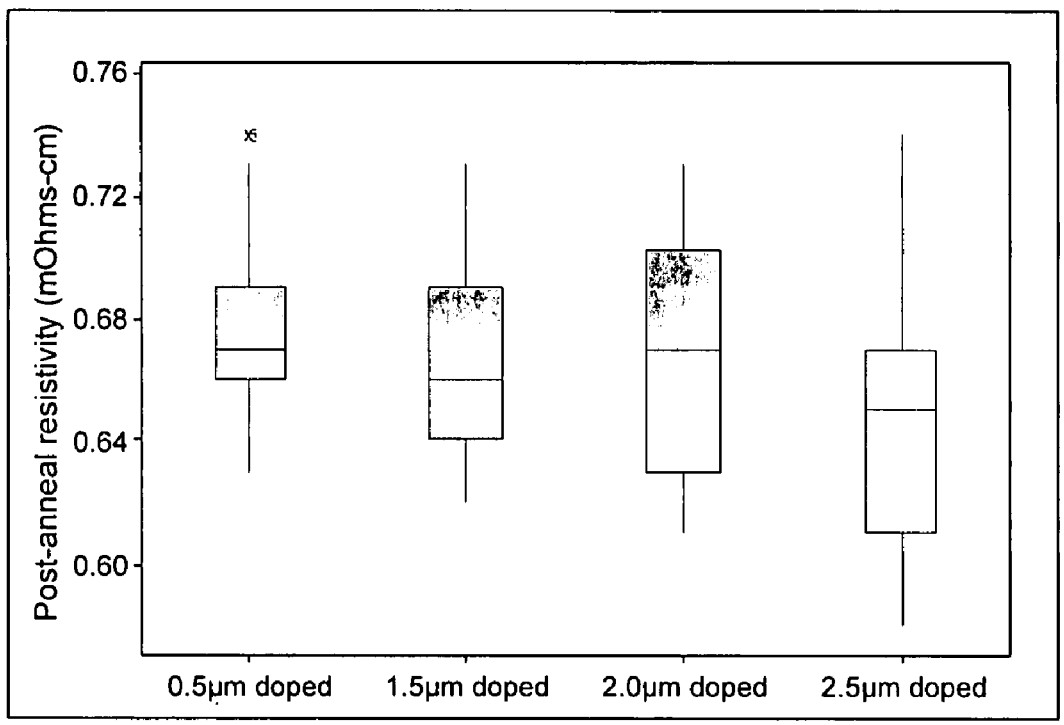

The impact of an anneal performed at 1100° C. on the film resistivity, mechanical stress and stress gradient properties can be analyzed by capping the deposited Si film with an oxide layer in order to prevent the loss of dopants. In addition, this allows one to have a "barrier" therefore preventing the contamination of the Si-based film by the annealing ambient. In that case, the Si film deposited is an in-situ doped amorphous Si film. The dopant used is phosphorus while nitrogen is used as the carrier gas for phosphine unless specified otherwise. Film resistivity The resistivity results achieved for various film thickness before and after annealing the Si layer are shown in FIG. 7. This figure demonstrates that the annealing step significantly lowers the film resistivity. Prior to annealing the films, the resistivity is approximately between 0.7 to 1.1 mΩ-cm. However, after annealing the film, one can notice that the film resistivity is reduced to a range of approximately 0.58 to 0.74 mΩ-cm. The as-deposited film resistivity is associated with a carrier concentration of approximately $8.0 \times 10^{19}$ at./cm$^3$ as demonstrated in FIG. 8. After annealing at 1100° C., one can therefore notice from FIG. 8 that the carrier concentration increases up to approximately $1.0 \times 10^{20}$ at./cm$^3$ as more phosphorus atoms are electrically activated by the high temperature process step.

Film Stress

Figure 9:
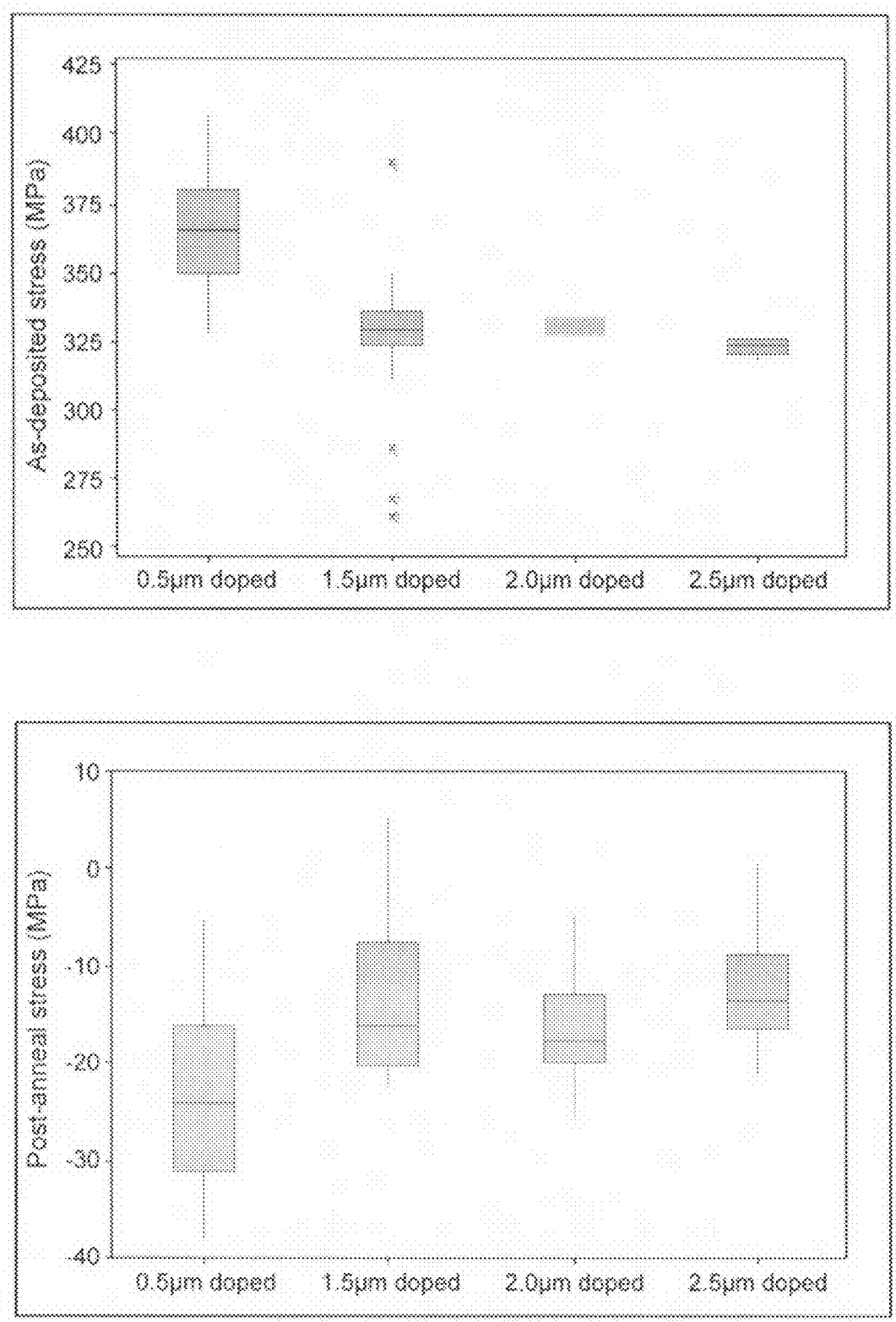
FIG. 9 shows the as-deposited and post-annealed Si film mechanical stress.

The mechanical stress results achieved for various film thickness before and after annealing the Si layer are shown in FIG. 9. This figure demonstrates that the anneal significantly lowers the absolute value of the film stress. Prior to annealing the films, the mechanical stress is approximately of 325 MPa for thick films of 1.5, 2.0 or 2.5 μm. On the other hand, the film stress is approximately between 325 to 400 for the thin 0.5 μm layer. The anneal at 1100° C. therefore induces a drastic change in the film stress properties. One can notice in FIG. 9 that the stress is now between −25 to 0 MPa after annealing for the thick 1.5 μm, 2.0 μm and 2.5 μm films while it is between −40 and −5 MPa for the thin 0.5 μm film.

Stress Gradient

According to Lee et al., the stress gradient calculated from cantilever structures can be expressed as follow:

$$\Delta\sigma = \frac{Ed}{L^2}$$

Where . . .

Figure 10:
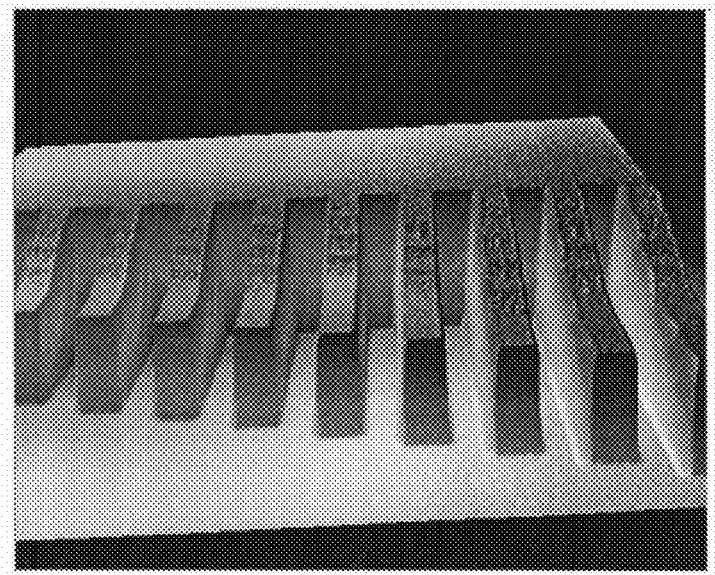
FIG. 10 is a 3D-interferometer image of mechanically released cantilever structures fabricated with an as-deposited 2.5 µm Si film.

Δσ=stress gradient
E=Young's Modulus of the film
d=deflection of the cantilever beam
L=length of the cantilever beam FIG. 10 presents a 3D-interferometer image of 300 μm-iong cantilevers fabricated with a 2.5 μm as-deposited in-situ doped Si film without performing annealing. This image displays severely bent structures without any possible use of such a film as it could not be predictable nor controlled in terms of mechanical behavior. In such a case, the stress gradient achieved is clearly above 10 MPa/μm and therefore, obviously not suitable for MEMS/NEMS applications.

Figure 11:
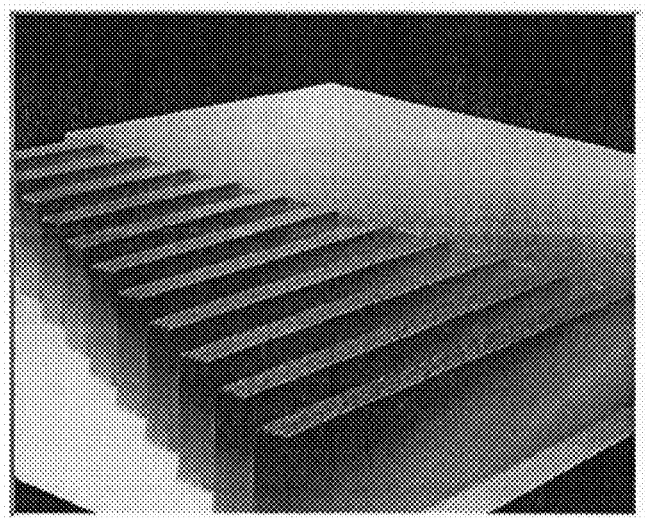
FIG. 11 consists of SEM and 3D-interferometer images of mechanically released cantilever structures fabricated with a 1100?C-annealed 2.5 µm Si film.

FIG. 11 on the other hand shows SEM and 3D-interferometer images of cantilevers after a film oxidation followed by a 1 h anneal at 1100° C. and finally, a sacrificial oxide removal step in a HF-based solution. In such a case, the stress gradient achieved is impressive as it is of approximately 0.01 MPa/μm which is sufficient for most MEMS/NEMS applications since a stress gradient lower than 3 MPa/μm is generally required.

Such results are impressive as in addition to the outstanding resistivity achieved and discussed in Section 0, the structural properties demonstrate a cantilever beam deflection of ~0.006 µm ($\Delta\sigma$=0.01 MPa/µm) as opposed to a deflection of 0.8-2 µm for our competitors.

Elemental Concentrations and Profiles

FIG. 12 shows the elemental profiles obtained by SIMS of an as-deposited 0.5 µm layer and a 0.5 µm film annealed at a temperature of 1100° C. Those profiles demonstrate (cf. FIG. 13) that for an as-deposited 0.5 µm film, the phosphorus concentration is of 0.6%, while the oxygen concentration ranges from 0.004 to 0.006%. The hydrogen concentration is between 0.02% and 0.002% for the as-deposited film. Finally, the nitrogen concentration is of 0.00002% prior to annealing. As demonstrated in FIG. 12 and summarized in FIG. 13, the P and N concentrations remain unchanged after annealing such a 0.5 µm film up to 1100° C. On the other hand, the oxygen and the hydrogen concentrations are significantly reduced after such a high-temperature processing of the Si film.

FIG. 14 and FIG. 15 present the same results but for a thicker 2.5 µm in-situ P-doped amorphous Si film. Once again in that particular case, the P and the N concentrations remain unchanged while the oxygen and the hydrogen profiles are significantly lowered. It is worth mentioning that the 0 and P peaks in the middle of the film are caused by an intentional pause occurring in the middle of the deposition cycle.

The outstanding film resistivity, stress and stress gradient properties can therefore be understood from three different possible perspectives:

i. An increased carrier concentration of electrically activated phosphorus atoms due to the high temperature process step at 1100° C.;
ii. An increased grain size and film roughness due to the high temperature anneal step.
iii. A reduced contaminant concentration;

Carrier Concentration

Figure 8:
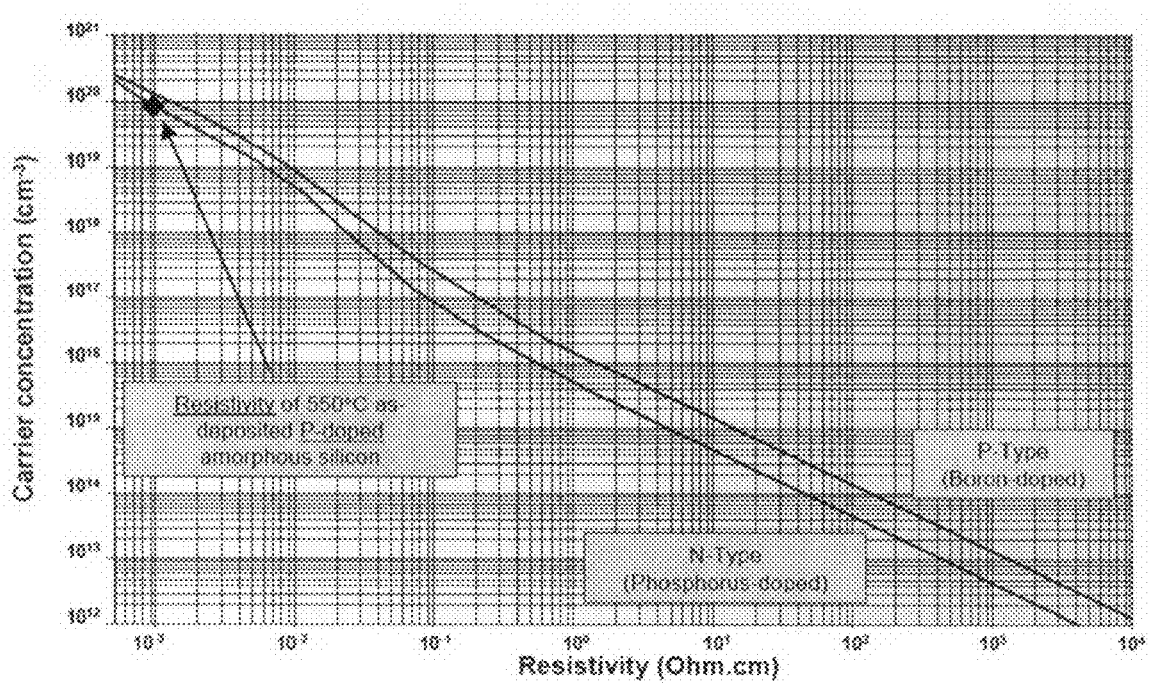
FIG. 8 shows the bulk resistivity of phosphorus-doped amorphous silicon (ref. Ouellet et al.)

Even though FIG. 8 demonstrates that the carrier concentration increases after the annealing step, it appears from FIG. 12 to FIG. 15 that there is absolutely no change in terms of the phosphorus dopant concentrations. It is therefore concluded that the low-stress/low-stress gradient values are not achieved as a result from a change in terms of dopant concentrations.

Increased Grain Size and Film Roughness

Figure 16:
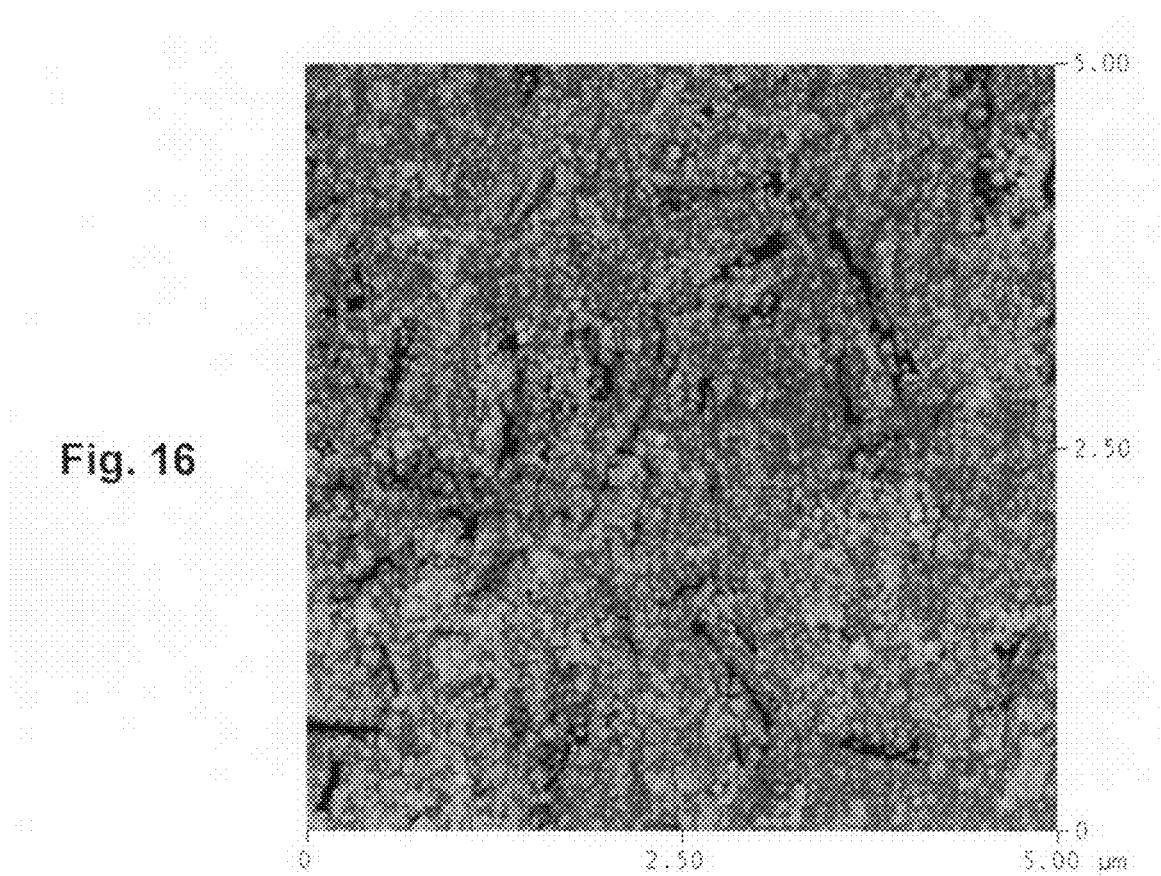
FIG. 16 is an atomic Force Microscopy (AFM) image of an as-deposited 0.5 µm in-situ doped Si film.
Figure 17:
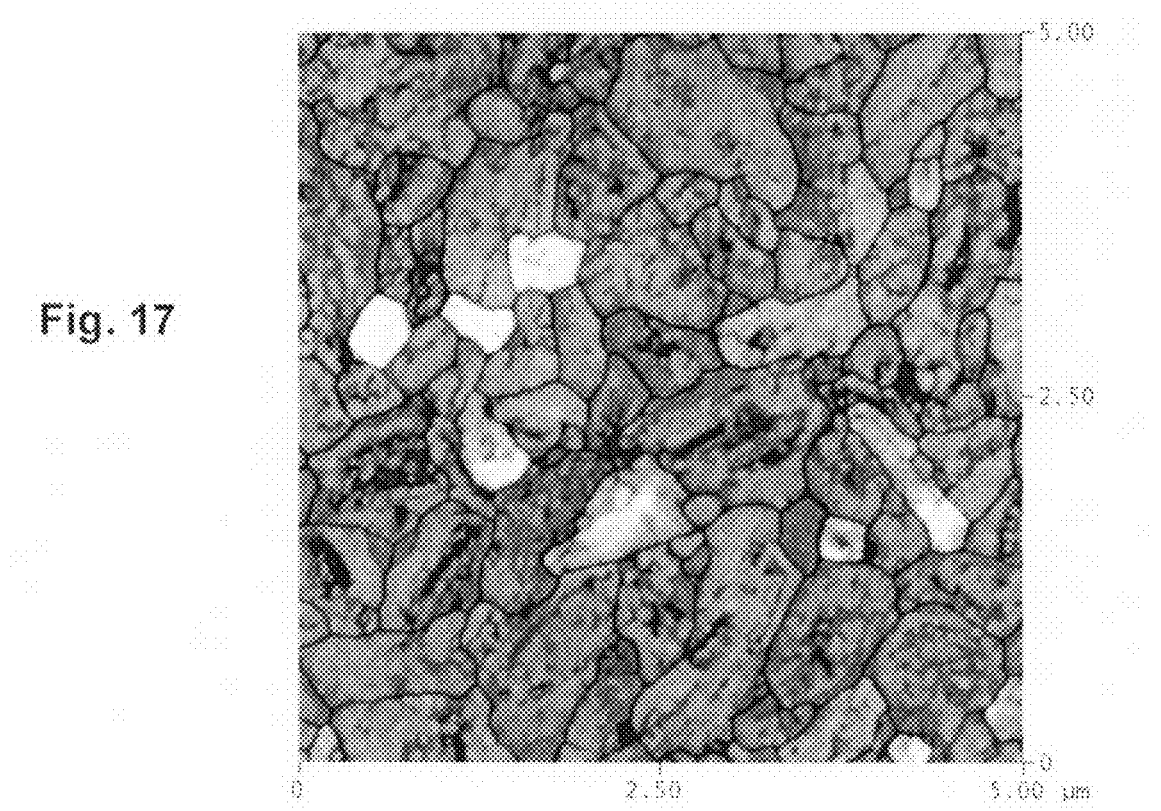
FIG. 17 is an atomic Force Microscopy (AFM) image of a 0.5 µm in-situ doped Si film annealed at 1100?C.
Figure 18:
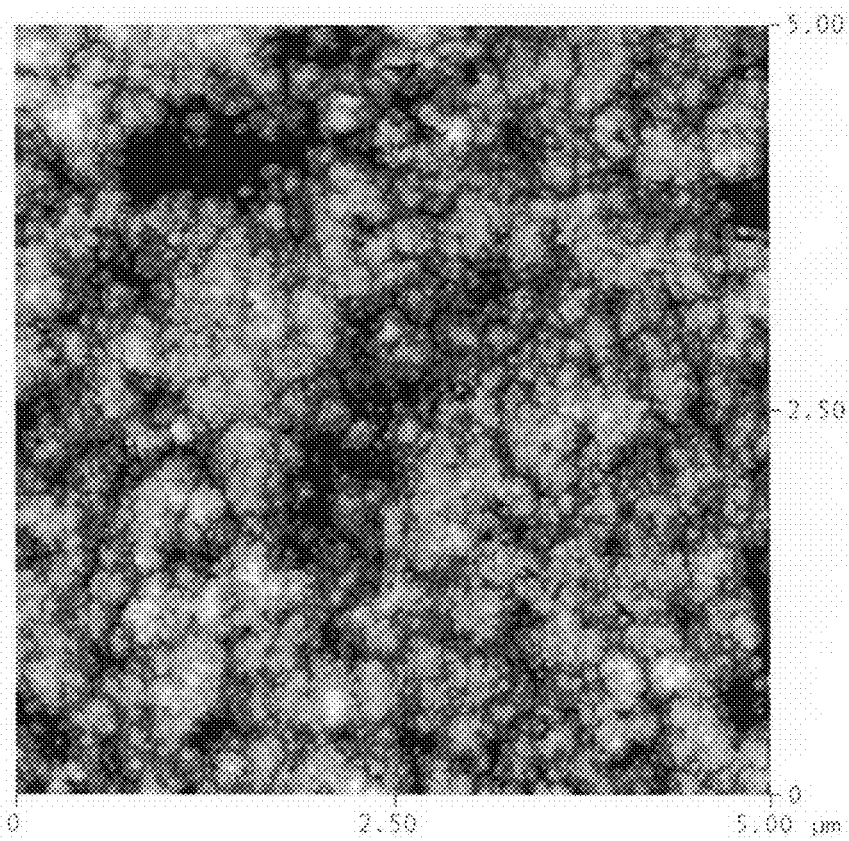
FIG. 18 is an atomic Force Microscopy (AFM) image of an as-deposited 2.5 µm in-situ doped Si film.
Figure 19:
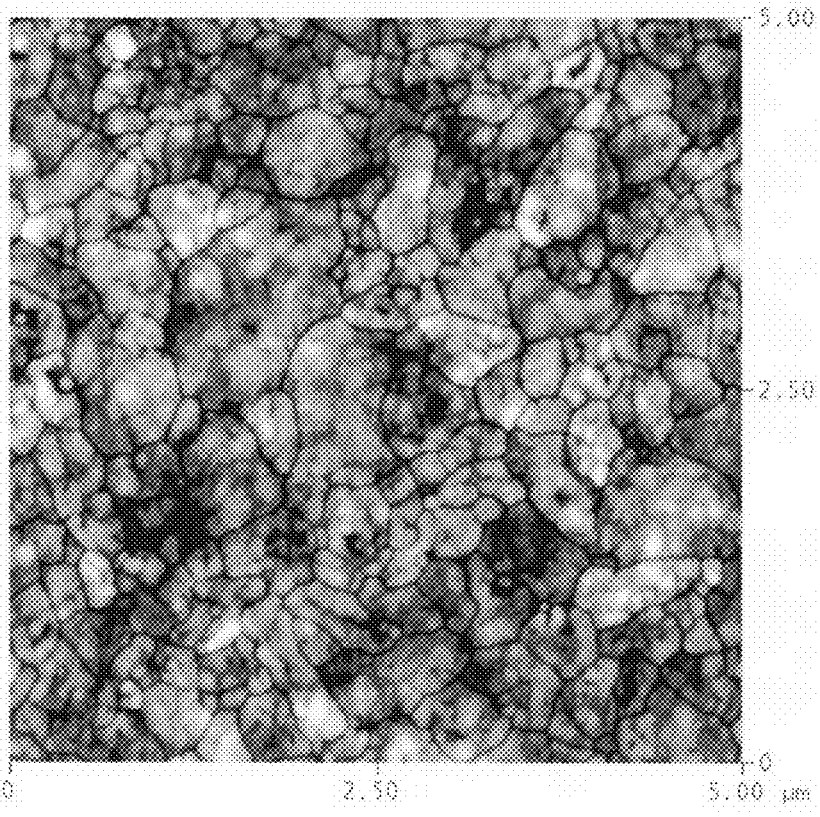
FIG. 19 is an atomic Force Microscopy (AFM) image of a 2.5 µm in-situ doped Si film annealed at 1100?C.

FIG. 16 and FIG. 17 present Atomic Force Microscopy (AFM) images of a 0.5 µm in-situ doped Si film prior to and after a 1100° C. annealing step, respectively. Those images demonstrate that the Si film roughness (Rms) increases from 2.908 nm to 5.016 nm after the high-temperature annealing process. Similar results are obtained for the 2.5 µm film before and after annealing as presented in FIG. 18 and FIG. 19, respectively. Those images demonstrate that the Rms film roughness increases from 5.321 to 5.729 nm.

Based on the above roughness data, one can notice that even though the thin 0.5 µm film displays a significant roughness change, the thick 2.5 µm film only shows a roughness increase of approximately 8%.

It is possible to notice from the AFM images (cf. FIG. 16 to FIG. 17) that the annealing condition impacts the structure of the films itself. Prior to annealing, it appears that the grain sizes are all approximately of 0.05 µm for any film thickness. It therefore confirms that our amorphous Si film is in fact a quasi-amorphous film. The phenomenon observed after annealing appears to be grain growth. It was determined that the sizes of those grains after annealing at 1100° C. for 1 h are between 0.25 and 0.42 µm on average for any film thickness.

Figure 20:
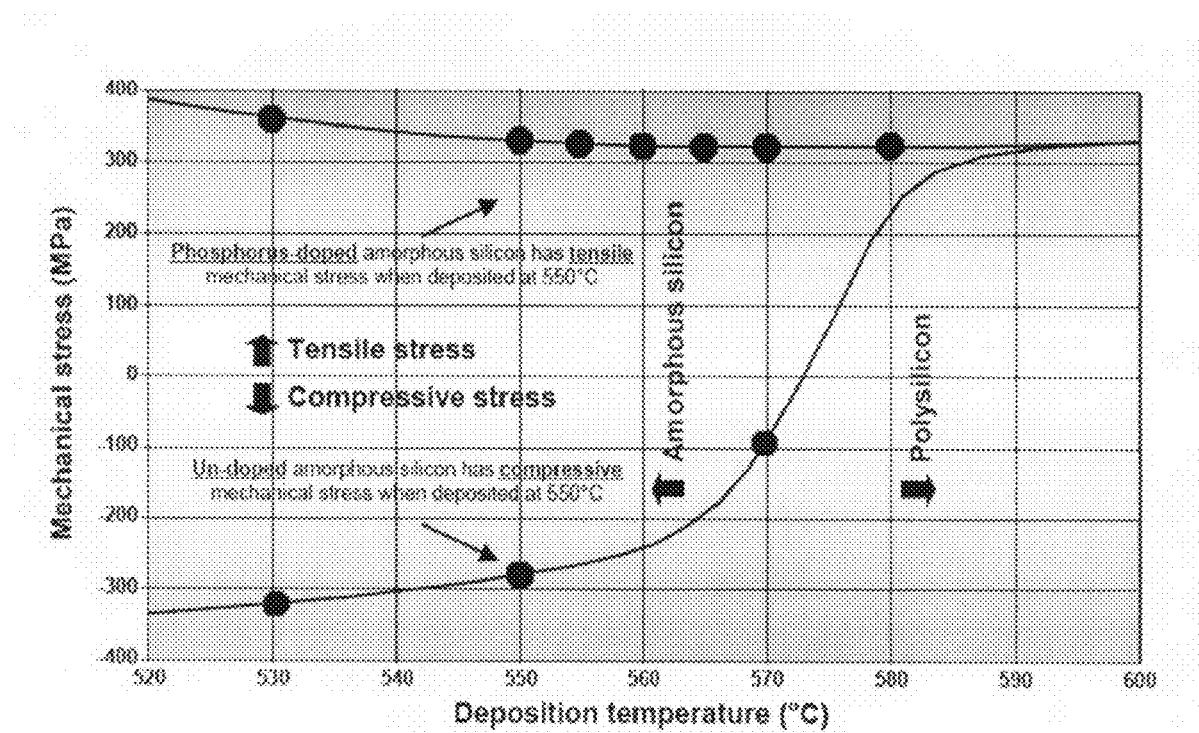
FIG. 20 shows the tensile mechanical stress of as-deposited in-situ phosphorus doped Si films (from Ouellet et al.)

The above AFM images demonstrate a significant increase in terms of grain size growth which could lead one to conclude that this grain growth might be responsible for the drastic stress change presented previously. On the other hand, it has been demonstrated by Ouellet et al. (cf. FIG. 20) that the tensile mechanical stress of a phosphorus doped-Si film barely varies as a function of the deposition temperature despite the significant changes in terms of film grain sizes and roughness associated over such a deposition temperature span.

It is therefore concluded that neither the roughness nor the grain size changes could lead to the reduction in terms of mechanical stress and stress gradient after the high-temperature annealing process of the Si films.

Reduced Contaminant Concentrations

In order to identify and understand the root-cause of the lowered concentrations of oxygen and hydrogen after anneal, a thorough analysis of the related binary phase diagrams is conducted. A similar investigation is also pursued for the elements that did not demonstrate any significant variation in terms of concentrations prior to as opposed to after the annealing step.

Si—O Binary Phase Diagram

Figure 21:
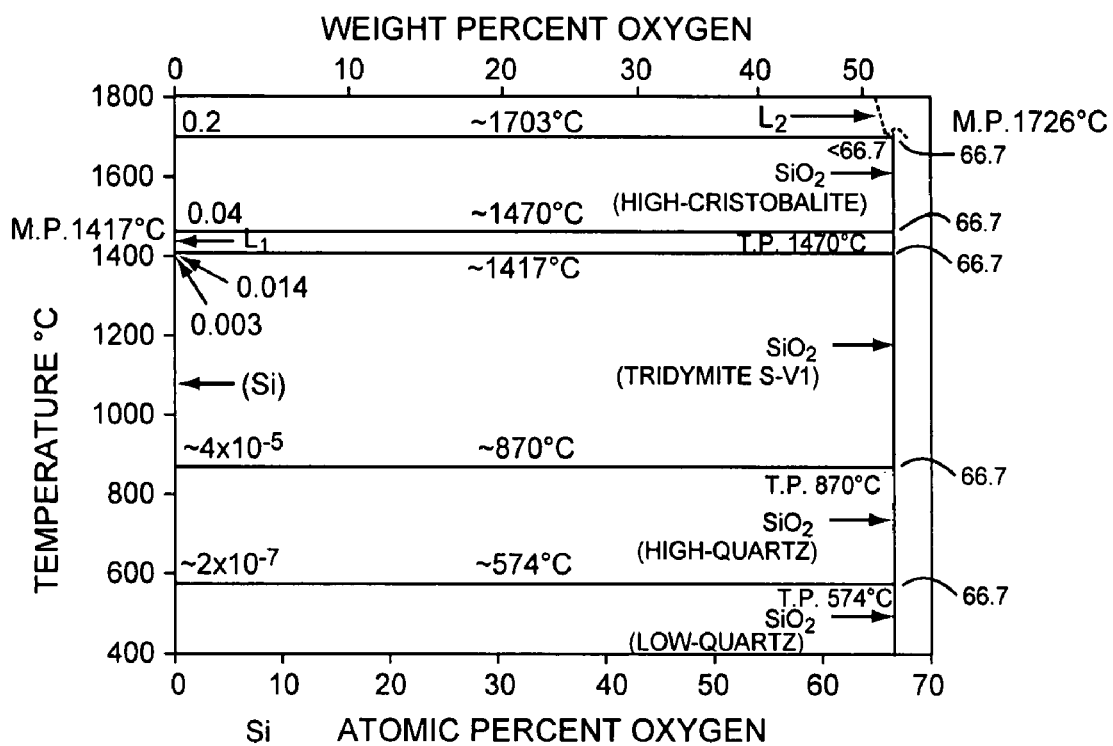
FIG. 21 is an Si—O binary phase diagram (ref. Wriedt)
Figure 21:
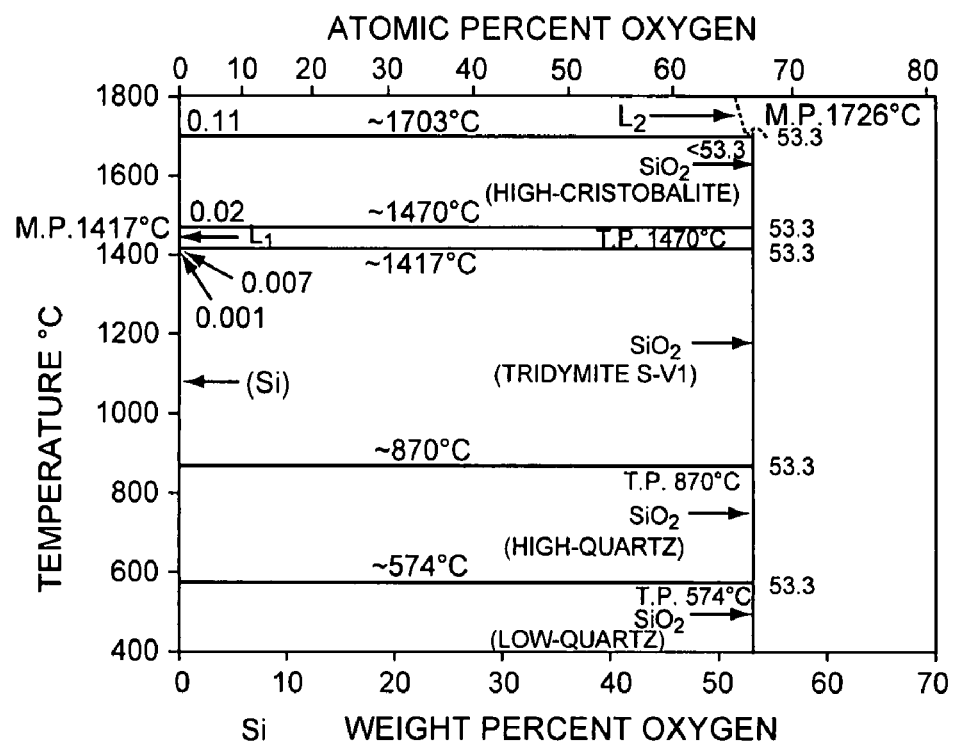
Figure 22:
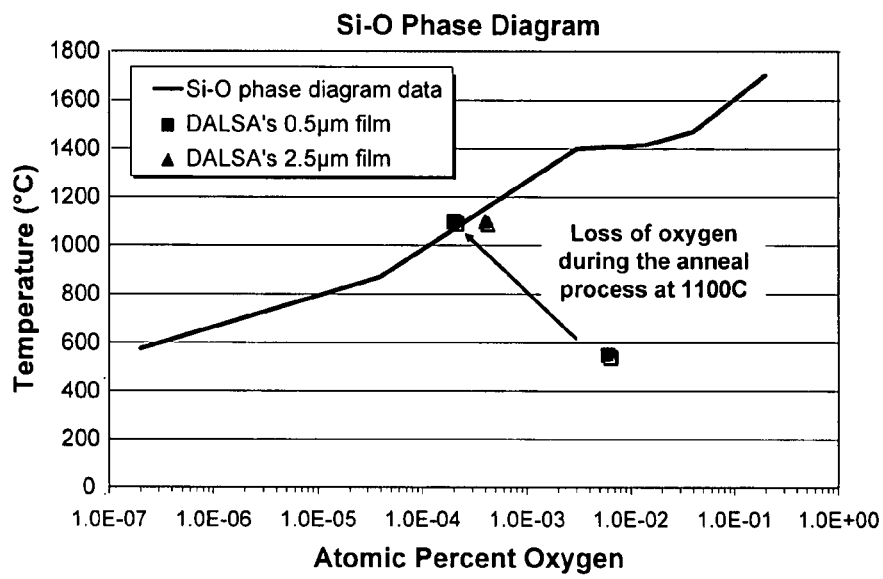
FIG. 22 is an enlargement of the low oxygen atomic concentrations area of the Si—O binary phase diagram along with empiric data gathered prior to and after annealing.

A close look at the data presented in FIG. 12 through FIG. 15 demonstrate that the extremely low oxygen concentrations are not associated with any particular binary phase from the Si—O binary phase diagram shown in FIG. 21. On the other hand, if one plots the temperature and oxygen concentrations presented in the low oxygen concentration area and enlarge the graph obtained, the result is the partial diagram presented in FIG. 22. This diagram also shows the results obtained from the SIMS profiles of 0.5 and 2.5 µm Si films (cf. FIG. 12 through FIG. 15).

In such a case, it has been determined that the high-temperature anneal at 1100° C. leads to an outgassing of the oxygen as previously reported by Binns et al. Once the oxygen outdiffuses to levels of approximately $2.0 \times 10^{-4}$ atomic % of oxygen, it reaches the solubility limit of oxygen in silicon at 1100° C. Such a concentration will remain unchanged upon cooling down the wafers to room temperature.

Si—H Binary Phase Diagram

Figure 23:
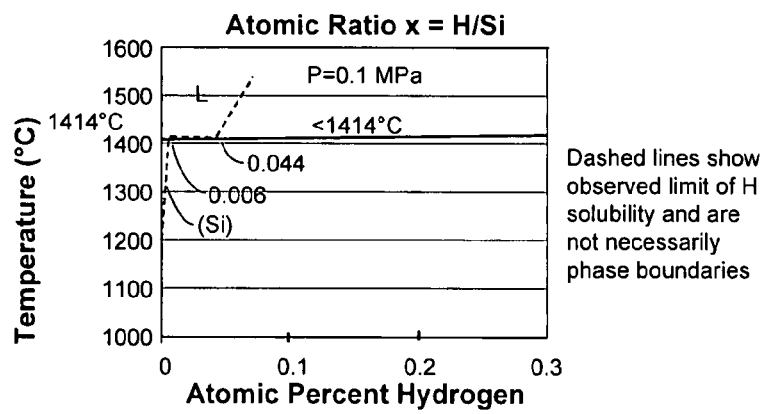
FIG. 23 is a Si—H binary phase diagram (ref. Manchester)
Figure 24:
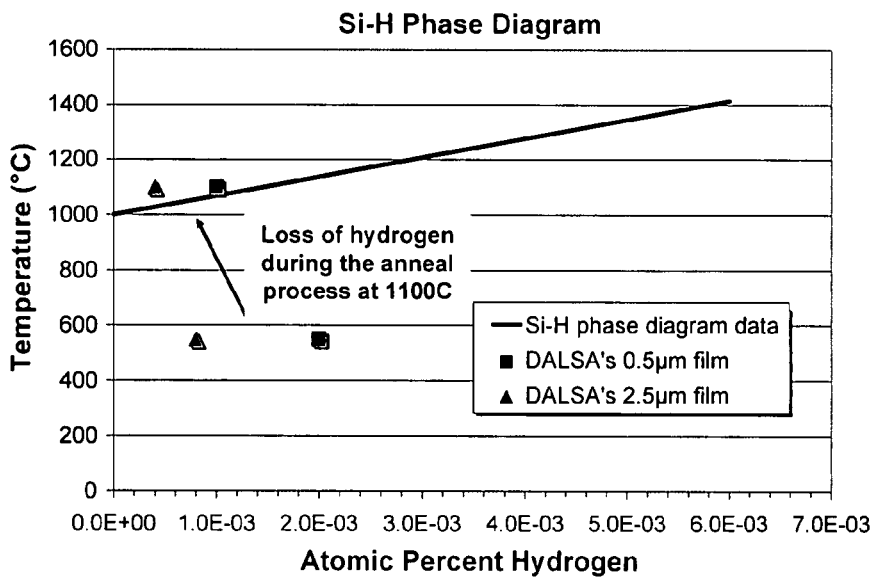
FIG. 24 is an enlargement of the low hydrogen atomic concentrations area of the Si—H binary phase diagram along with empiric data gathered prior to and after annealing.

As for the Si—O binary system, the observation of the data presented in FIG. 12 through FIG. 15 demonstrate that the low hydrogen concentrations are not associated with any specific phase from the Si—H binary phase diagram presented in FIG. 23. Once again, if one plots the temperature and hydrogen concentrations presented in the low hydrogen concentrations area and enlarges the graph obtain, the result is the diagram presented in FIG. 24. This diagram also shows the results obtained from the SIMS profiles of 0.5 and 2.5 µm Si films (cf. FIG. 12 through FIG. 15).

In such a case, it has been determined that the high-temperature anneal at 1100° C. leads to an outgassing of the hydrogen. Once the hydrogen outdiffuses to levels between approximately $1.0 \times 10^{-2}$ and $1.0 \times 10^{-3}$ atomic % of hydrogen, it reaches the solubility limit of hydrogen in Si at 1100° C. The hydrogen concentration will remain unchanged upon cooling down the samples to room temperatures.

Si—N Binary Phase Diagram

The N concentrations measured in an as-deposited or 1100° C.-annealed 0.5 µm P-doped Si film are of approximately 0.00002% as demonstrated in FIG. 12 and FIG. 13. In addition, the N concentrations of an as-deposited or 1100° C.-annealed 2.5 µm P-doped Si film are of 0.00006% as observed in FIG. 14 and FIG. 15.

As opposed to the Si—O and SiH binary systems, it appears from the results stated above that there is no change in terms of N concentration after the high-temperature annealing process. This can be explained by understanding the Si—N binary phase diagrams presented in FIG. 25. This Figure demonstrates that for nitrogen concentrations above approximately 0.000008%, there is no phase change at temperatures below the melting temperature of $Si_3N_4$ which is of 1414° C.

As there is no change in terms of nitrogen concentration in the doped Si films when comparing elemental profiles prior to and after annealing the layers, it is therefore clear that concentration variations for this impurity do not play a role in the stress and stress gradient changes observed after annealing the doped Si layer at high temperatures.

Si—C Binary Phase Diagram

Figure 26:
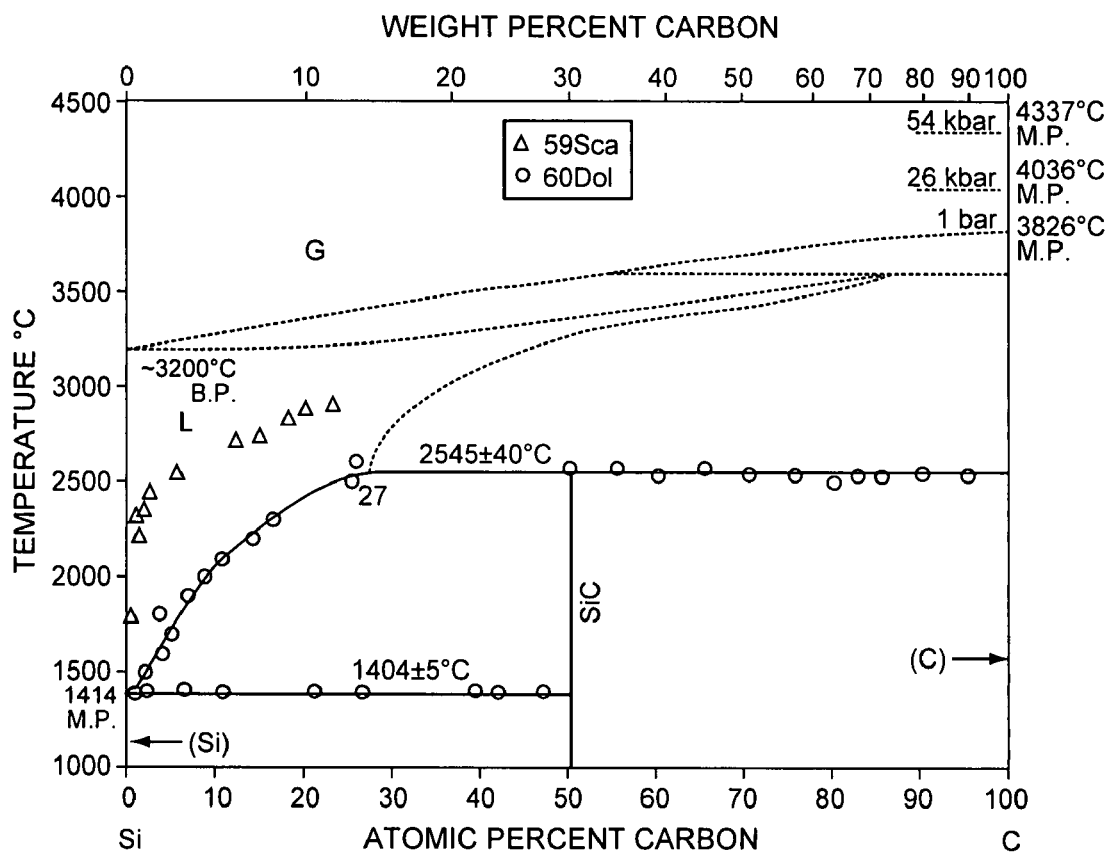
FIG. 26 is an Si—C binary phase diagram (ref. Olesinski et al.).

Although the carbon elemental profile has not been measured in the Si films presented in FIG. 12 and FIG. 14, the Si—C binary phase diagram presented in FIG. 26 demonstrate that there is no phase change even at low carbon concentrations at temperatures below 1404±5° C. Therefore based on the conclusions reached with the Si—N binary system (cf. Section 0), the concentration variations for carbon impurities in the doped Si films should not have an impact on the stress or stress gradient properties even when processing the samples at high temperatures.

Si—P Binary Phase Diagram

Figure 27:
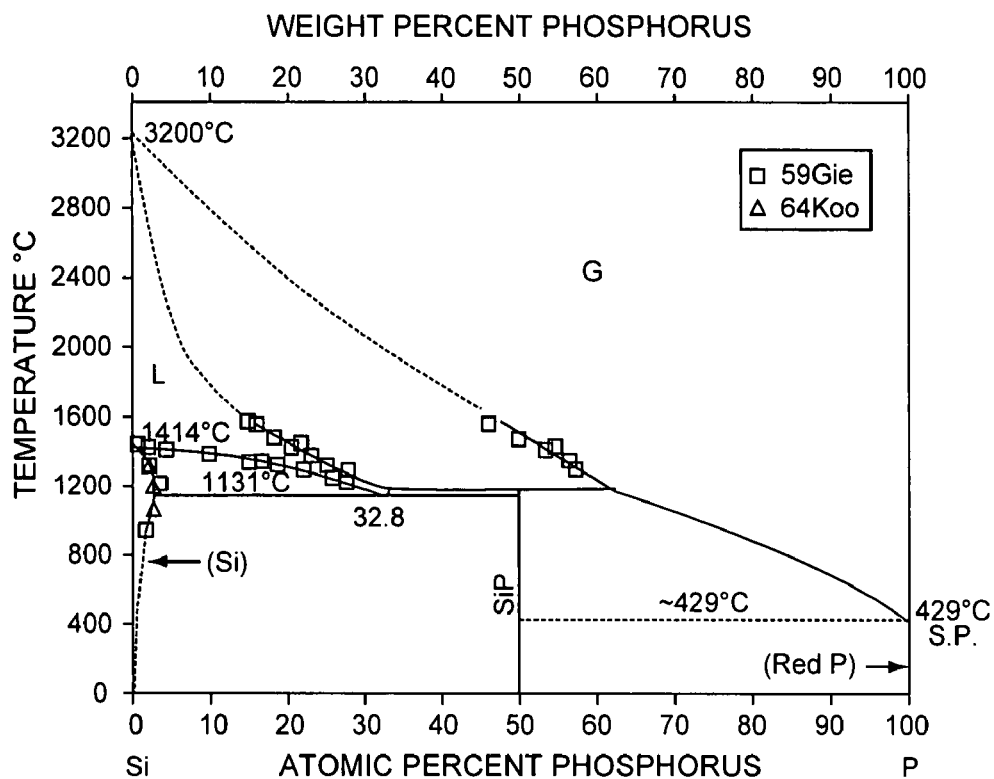
FIG. 27 is an Si—P binary phase diagram (ref. Olesinski et al.).
Figure 28:
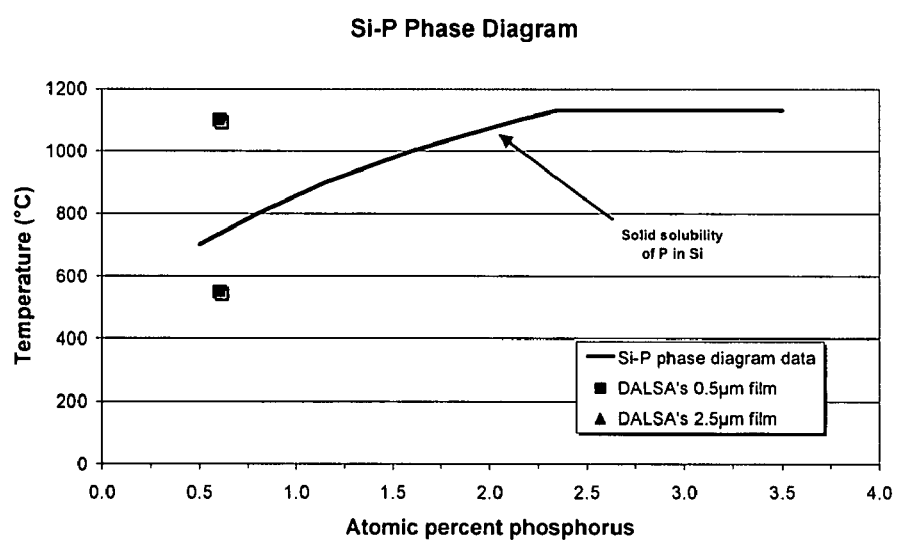
FIG. 28 is an enlargement of the low phosphorus atomic concentrations area of the Si—P binary phase diagram along with empiric data gathered prior to and after annealing.

It has been shown in FIG. 12 to FIG. 15 that for the 0.5 μm and 2.5 μm Si doped films that the phosphorus concentrations were identical before and after the 1100° C. annealing process. The Si—P binary phase diagram presented in FIG. 27 appears to show high phosphorus concentrations above 2.5% at high temperatures. A combination of the phase diagram from FIG. 27 along with data we obtained and presented from FIG. 12 to FIG. 15 demonstrates that the P concentrations we obtained would be above the solubility limits of P in Si (cf. FIG. 28). As this is physically impossible, it appears that the explanation lies in the fact that different authors obtained different results due to the complex experimental requirements to assess a comprehensive Si—P binary phase diagram. The Si—P phase diagram presented in FIG. 27 was published by Olesinski et al. On the other hand, other groups cited by Olesinski et al. such as Abrikosov et al., Tamura and Uda et al. clearly obtained P concentrations between 0.3 and 0.6% at a temperature of 1100° C. which are in good correlation with the data we achieved.

Further details relating to the above properties are available in the following documents, which are herein incorporated by reference:

i. N. Kh. Abrikosov, V. M. Glazov and L. Chen-yuan, *Individual and Joint Solubilities of Aluminum and Phosphorus in Germanium and Silicon*, Russ. J. Inorg. Chem., 7, 429-431 (1962).
ii. M. Tamura, *Dislocation Networks in Phosphorus Implanted Silicon*, Philos. Mag., 35, 663-691 (1977).
iii. K. Uda and M. Kamoshida, *Annealing Characteristics of Highly P+-ion-Implanted Silicon Crystal—Two-Step Anneal*, J. Appl. Phys., 48, 18-21 (1977).
iv. R. W. Olesinski and G. J. Abbaschian, *The C—Si (Carbon-Silicon) System*, Bulletin of Alloy Phase Diagrams, Vol. 5, No. 5, 1984, 486-486.
v. R. W. Olesinski, N. Kanani and G. J. Abbaschian, *The P—Si (Phosphorus-Silicon) System, Bulletin of Alloy Phase Diagrams*, Vol. 6, No. 2, 1985, 130-133.
vi. H. A. Wriedt, *The O—Si (Oxygen-Silicon)System*, Bulletin of Alloy Phase Diagrams Vol. 11, No. 1, 1990, 43-61.
vii. O. N. Carlson, *The N—Si (Nitrogen-Silicon) System, Bulletin of Alloy Phase Diagrams*, Vol. 11, No. 6, 1990, 569-573.
viii. M. J. Binns, C. A. Londos, S. A. McQuaid, R. C. Newman, N. G. Semaltianos and J. H Tucker, *Novel aspects of oxygen diffusion in silicon*, Journal of Materials in Electronics 7 (1996) 347-353.
ix. C. S. Lee, J. H. Lee, C. A. Choi, K. No and D. M. Wee, *Effects of phosphorus on stress of multi-stacked polysilicon film and single crystalline silicon*, J. Micromech. Microeng. 9 (1999), 252-263.
x. F. D. Manchester, *H—Si (Hydrogen-Silicon)*, Phase Diagrams of Binary Hydrogen Alloys, 2000, 197-209.
xi. Luc Ouellet and Robert Antaki, Method of fabricating silicon-based MEMS devices, U.S. Pat. No. 7,144,750, Dec. 5, 2006.

The previous Figures clearly demonstrate the impact of the concentrations of oxygen, hydrogen and/or other impurities on the Si film properties. Although low oxygen and hydrogen concentrations can be obtained by annealing the Si films, such impurity concentrations can be achieved during the deposition process of the Si films by appropriate hardware set-ups and configurations. Gas purifiers, ultra-high vacuum deposition systems and/or high grade gases can be used in order to minimize the concentration of those impurities among the film precursors. For example, Green et al. demonstrated that at low deposition temperatures, the oxygen contaminant levels in the film are dictated by the gas grade and then, by the residual oxygen in the deposition chamber. In addition, Hsu et al. demonstrated that for example the oxygen levels could be reduced by approximately a decade by adding point of use gas purifiers. Once this is achieved, one could now deposit low-stress/low-stress gradient in-situ doped Si films at low temperatures. It is then possible to control the film stress properties by controlling the oxygen, hydrogen and/or any other potential contaminants within the system in order to achieve the desired stress levels.

Nevertheless, such contamination levels are difficult to achieve despite the use in our case of point of use purifiers and high-purity gases. It would therefore require either a high-vacuum system which is generally associated with single-wafer processing chambers and would thus result in a low-throughput process considering the thickness required for MEMS or NEMS fabrication.

Figure 29:
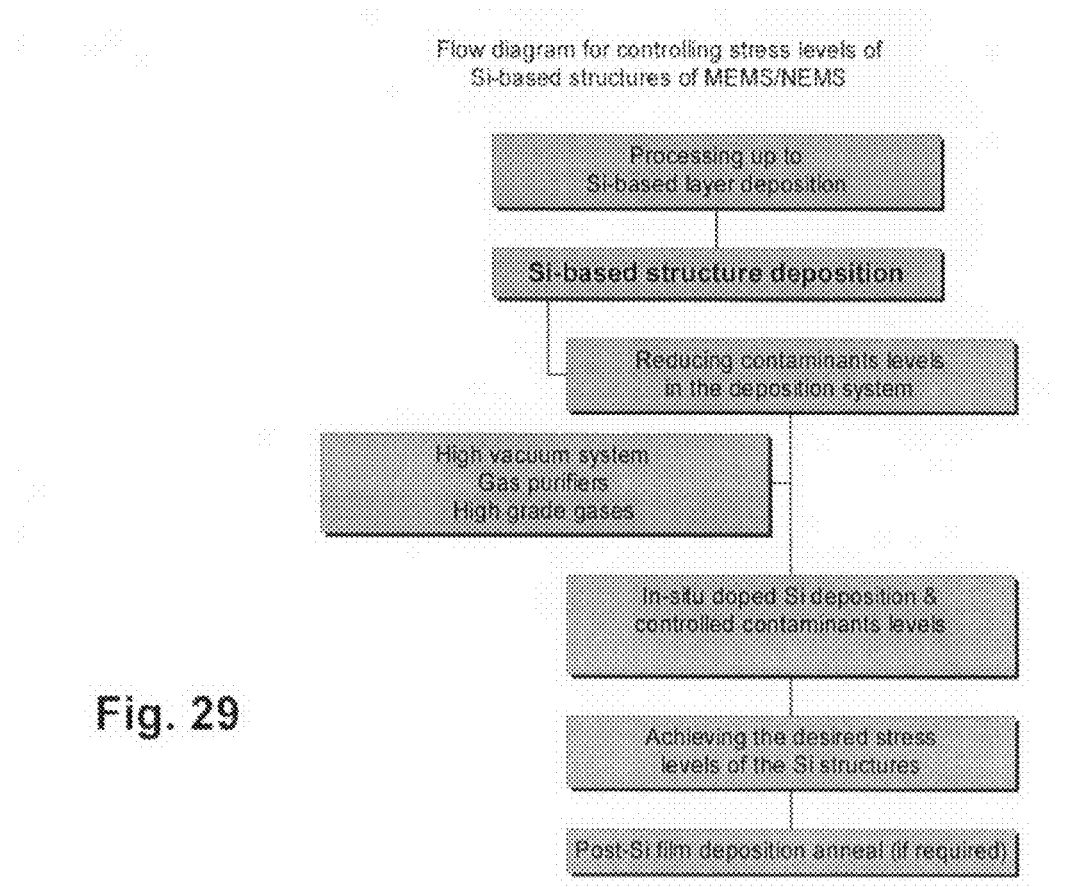
FIG. 29 is a flow diagram for controlling stress levels of Si-based structures of MEMS/NEMS.

Another possibility lies into deliberately introducing "contaminants" in the system to allow one to achieve specific stress levels. Such an approach is summarized in the flow diagram presented in FIG. 29.

In the comparative example, the novel Si-based film is deposited as follows:
  i. Horizontal LPCVD furnace;
  ii. Amorphous film deposition temperature (<580° C.);
  iii. High-purity (≧99.999%) precursors used: $SiH_4$ (partial pressure of 744 mTorr) and 1% $PH_3/N_2$ (partial pressure of 106 mTorr);
  iv. Deposition pressure <1000 mTorr;
  v. Pause of 20 min in the middle of the deposition cycle;
  vi. Point-of use gas purifiers for $SiH_4$ and $PH_3/N_2$.

Although the previous figures clearly demonstrate the impact of the oxygen and the hydrogen concentrations on the Si film properties, the possibility to achieve low mechanical stress and low stress gradient conditions without annealing with an in-situ phosphine doped Si film is difficult to reach. As mentioned previously, one would have to sacrifice the throughput to achieve such conditions which would therefore not be production-worthy considering the cost-of-ownership.

Method for Varying the Si Film Mechanical Stress

Although achieving a low-stress Si film would represent a trade-off between film properties and manufacturability, the understanding of the physics leading to such ideal conditions can still allow us to modify the film properties as desired. We now understand the impact the levels of impurities have on the mechanical stress of a Si film.

It is currently believed in the industry that a $N_2$ carrier gas for phosphine does not have any impact as it is inert. However, we clearly demonstrated that this gas has a tremendous impact on the film properties. We indeed demonstrated that we can significantly modify the film stress by solely replacing this $N_2$ carrier gas by Ar in order to carry the phosphine in the system.

By keeping the same deposition conditions, as described below, we achieved totally different stress properties in the embodiment in accordance with the invention.

i. Horizontal LPCVD furnace;
  ii. Amorphous film deposition temperature (<580° C.);
  iii. High-purity ($\geqq$99.999%) precursors used: $SiH_4$ (partial pressure of 744 mTorr) and 1% $PH_3/(N_2$ or Ar) (partial pressure of 106 mTorr);
  iv. Deposition pressure <1000 mTorr;
  v. Pause of 20 min in the middle of the deposition cycle;
  vi. Point-of use gas purifiers for $SiH_4$ and $PH_3/(N_2$ or Ar).

Figure 30:
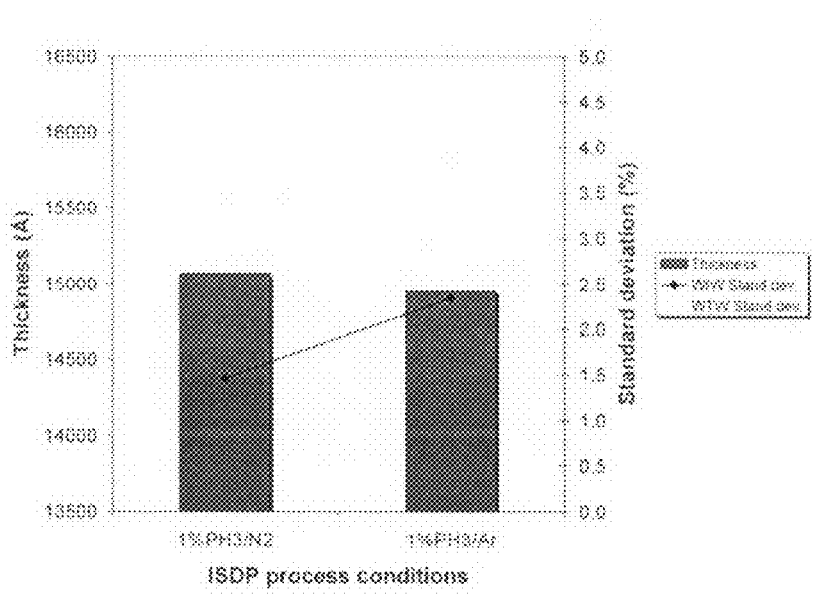
FIG. 30 is a histogram of the thickness after annealing for ISDP films deposited with 1% PH3/N2 vs. 1% PH3/Ar.

First of all in those conditions, we demonstrated that the thickness and the thickness distributions (within-wafer and wafer-to-wafer) were not significantly affected as demonstrated in FIG. 30. One could observe in this figure that there is no difference on average between a film deposited with 1% $PH_3/N_2$ as opposed to a film processed with 1% $PH_3/Ar$. As for the film uniformities, we can determine from FIG. 30 that the within-wafer standard deviation goes from approximately 1.5% to 2.5% for $PH_3/N_2$ and $PH_3/Ar$, respectively, while the wafer-to-wafer standard deviation is around 3.5% in both cases.

Figure 31:
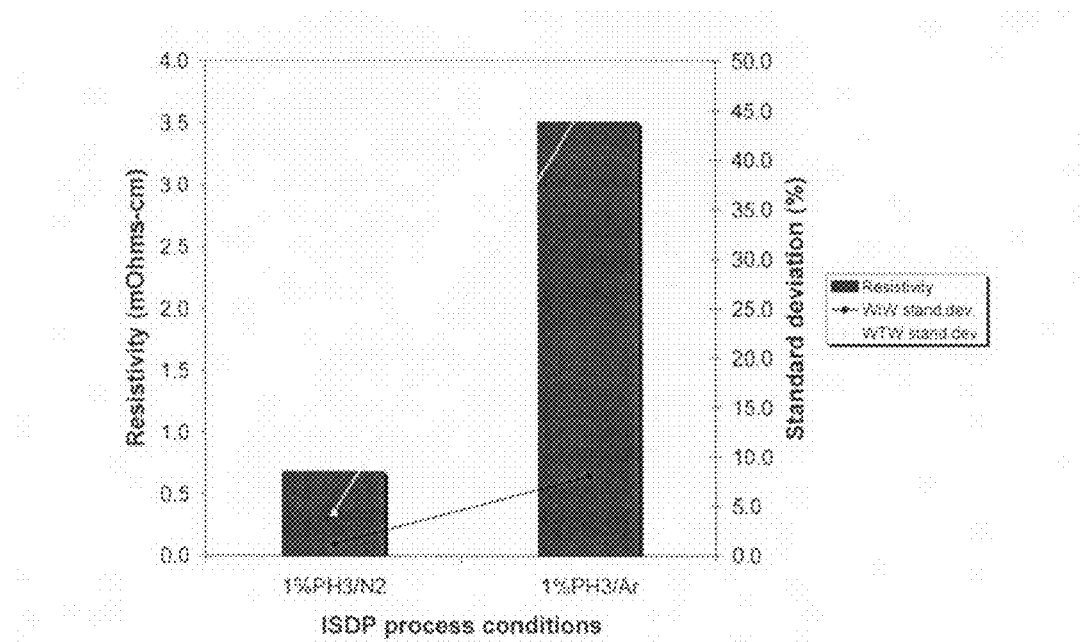
FIG. 31 is a histogram of the resistivity after annealing for ISDP films deposited with 1% PH3/N2 vs. 1% PH3/Ar.

As for the post-anneal film resistivity, one can observe FIG. 31 a significant difference when swapping the $N_2$ carrier gas for phosphine by Ar. While the $PH_3/N_2$ process leads to a film resistivity of approximately 0.7 mOhms-cm with standard deviations below 5%, the $PH_3/Ar$ process demonstrates a film resistivity of approximately 3.5 m$\Omega$-cm and within-wafer and wafer-to-wafer standard deviations of 8% and 46%, respectively.

Although such a difference appears to be an obstacle for further activities with the $PH_3/Ar$ film, it is worth mentioning and understanding that a resistivity of 3.5 m$\Omega$-cm is still extremely low for a doped Si film and suitable for MEMS and NEMS applications.

Figure 32:
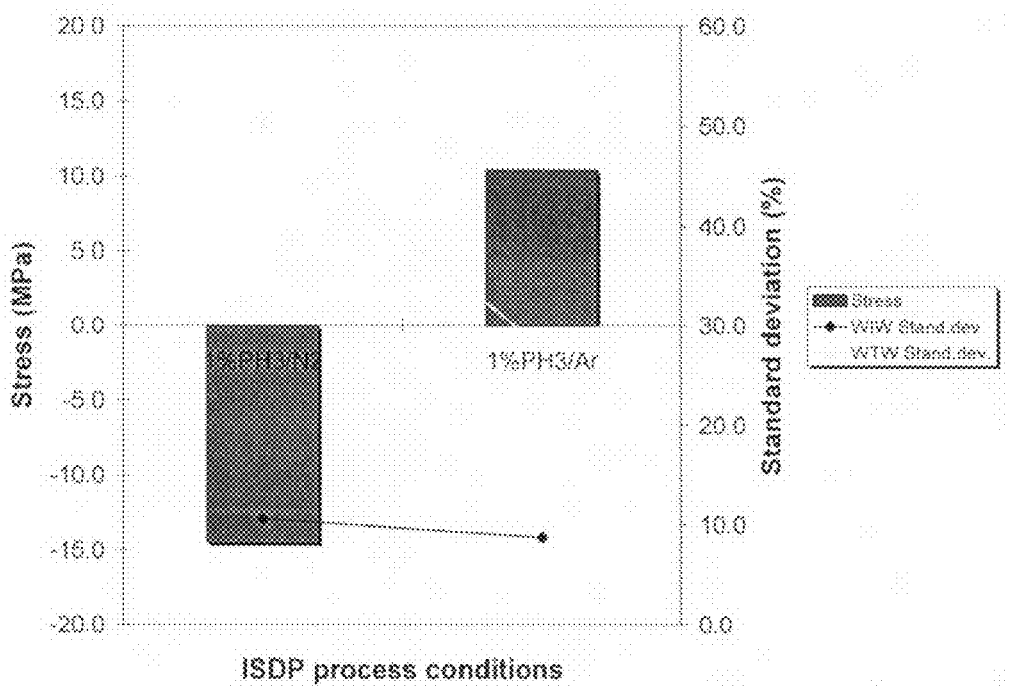
FIG. 32 is a histogram of the mechanical stress after annealing for ISDP films deposited with 1% PH3/N2 vs. 1% PH3/Ar.
Figure 33:
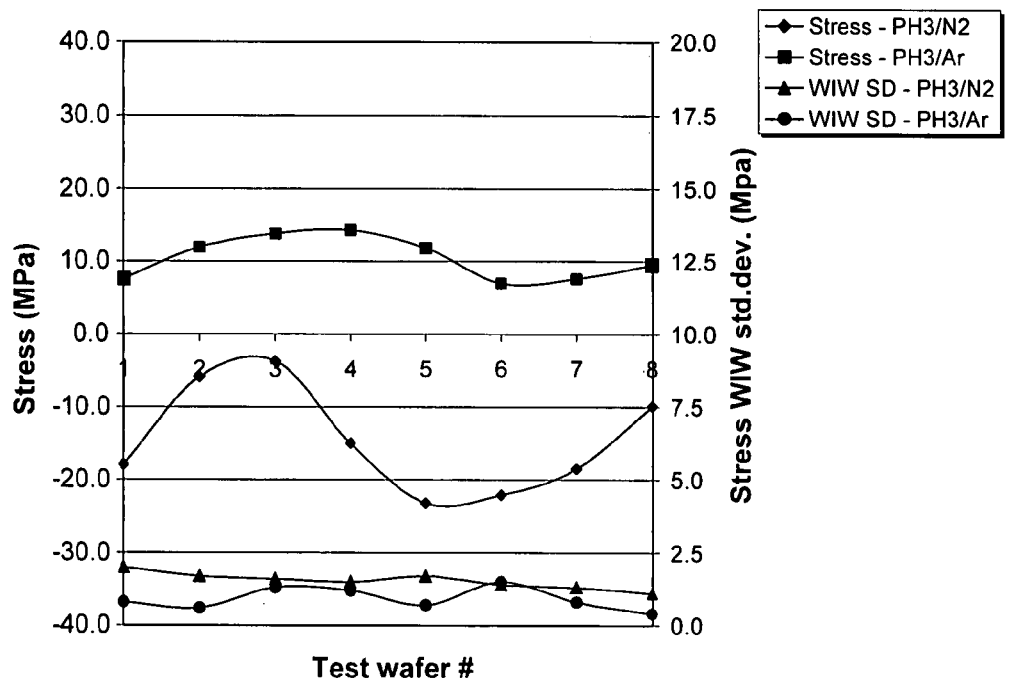
FIG. 33 is a mechanical stress after annealing for ISDP films deposited with 1% PH3/N2 vs. 1% PH3/Ar along the LPCVD deposition system.

But the most interesting film property modification is related to the stress of the film. As observed in FIG. 32, it has been determined that by using Ar as the carrier gas for phosphine in order to replace the $N_2$ for such a purpose, one would achieve a film with a low-tensile film stress as opposed to a obtaining a compressive film. This is a drastic change in terms of film properties that can open possibilities for new applications. In addition to such a surprising change in terms of the nature of the stress itself, one can observe in FIG. 32 that the stress wafer-to wafer standard deviation is also significantly improved by using Ar instead of $N_2$ as this value goes from approximately 50% to below 30%. This can also be observed by analyzing the results obtained across the entire furnace load and presented in FIG. 33. One can indeed observe that although the stress profiles are similar and follow the same trends, the range is noticeably reduced for the $PH_3/Ar$ process as opposed to the $PH_3/N_2$ process.

The observations of the SIMS profiles and the data extracted from those profiles presented in FIG. 34 to FIG. 38 demonstrate are summarized in the following sub-sections.

As-Deposited Films ($N_2$ Vs. Ar)

Figure 34:
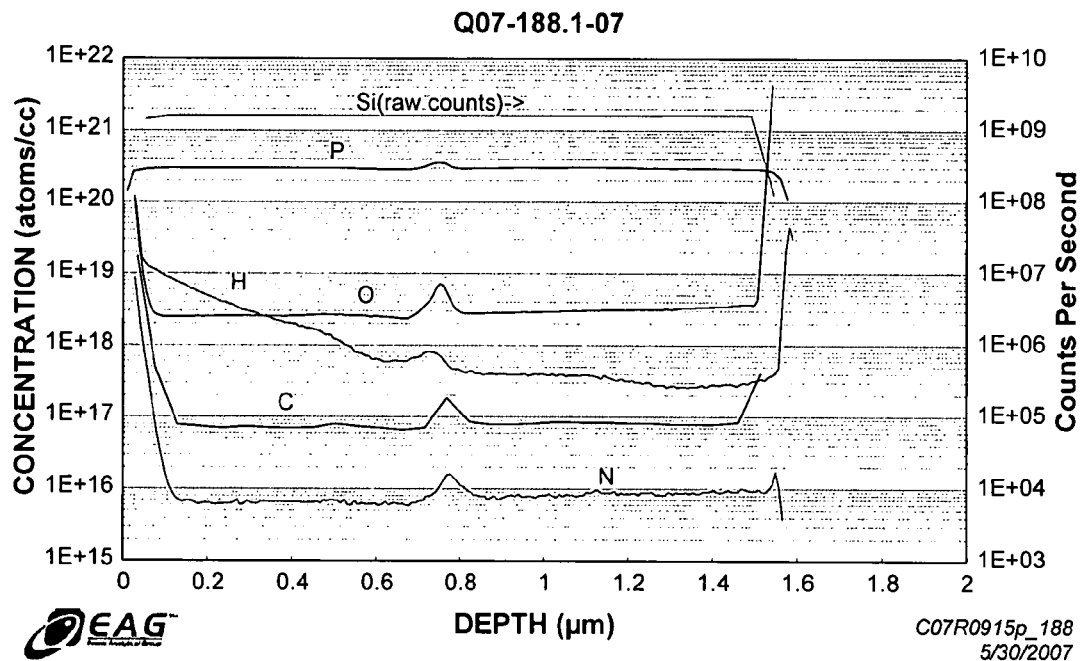
FIG. 34 consists of SIMS profiles for a PH3/N2 as-deposited sample of 1.5 μm ISDP.
Figure 36:
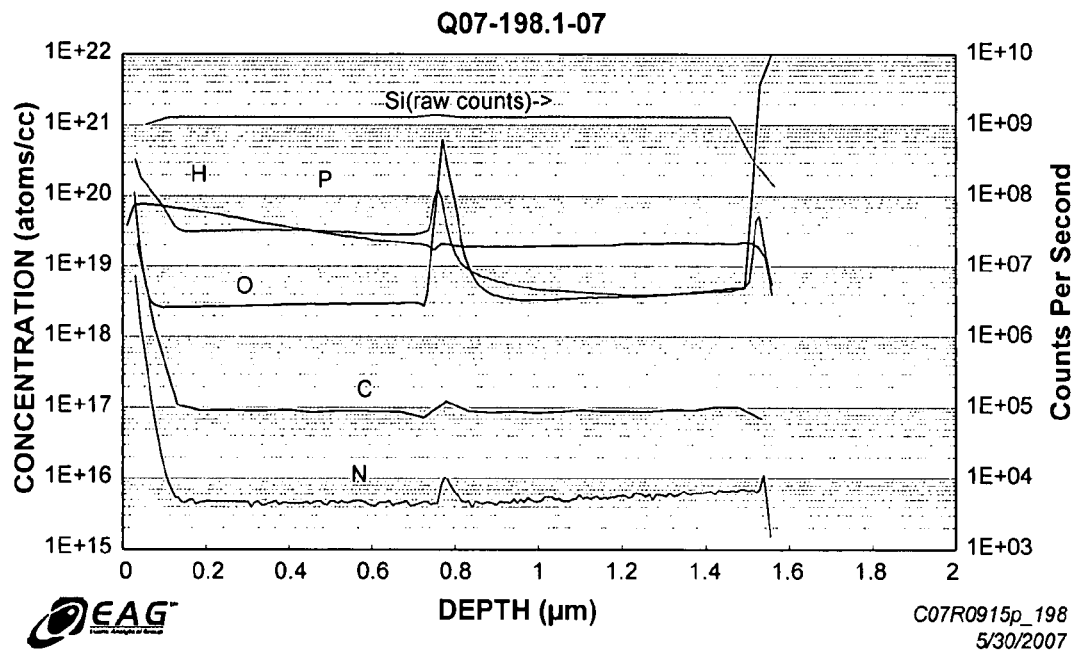
FIG. 36 consists of SIMS profiles for a PH3/Ar as-deposited sample of 1.5 μm ISDP.

The profiles from FIG. 34 and FIG. 36 along with data extracted from those SIMS graphics (cf. FIG. 38) demonstrate that the as-deposited O, N and C concentrations are similar when the phosphorus-Si film is deposited using $N_2$ or Ar as the carrier gas for phosphine. The main differences between those two processes are the fact that the phosphorus concentration is approximately 10 times lower (and less uniform) with the Ar-based film and the hydrogen concentration which is higher when using Ar as the phosphine carrier gas. Finally, there are differences related to the peaks observed in the middle of the films mainly for the oxygen and hydrogen profiles.

Annealed Films ($N_2$ Vs. Ar)

Figure 35:
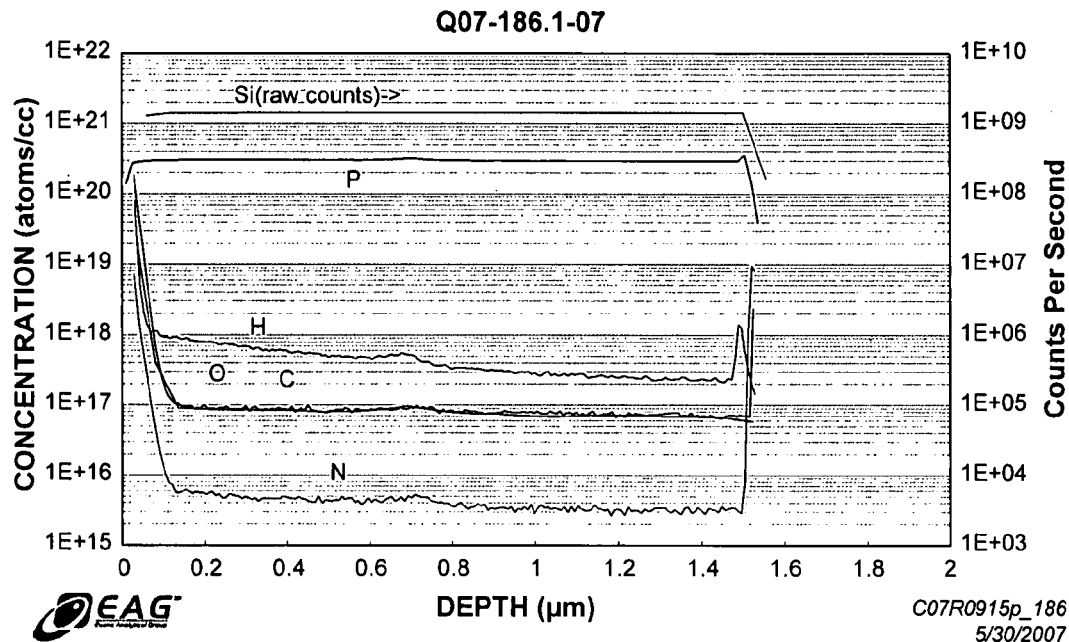
FIG. 35 consists of SIMS profiles for a PH3/N2 annealed sample of 1.5 μm ISDP.
Figures 37, 38:
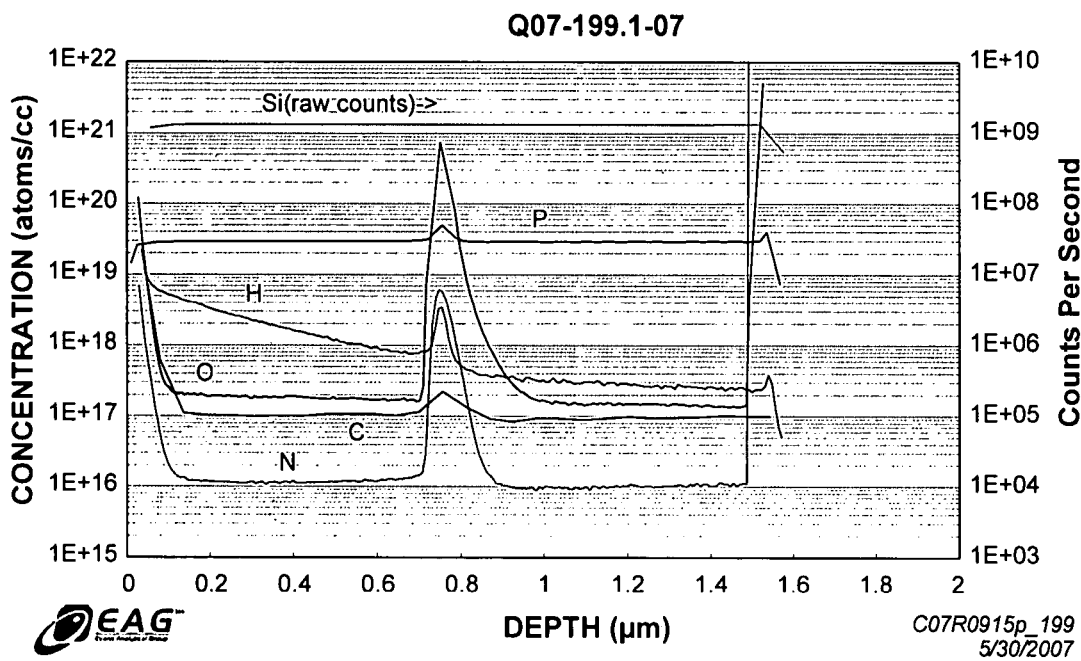
FIG. 37 consists of SIMS profiles for a PH3/Ar annealed sample of 1.5 μm ISDP.
FIG. 38 shows elemental concentrations in as-deposited and post-anneal 1.5 μm in-situ P-doped amorphous Si films deposited with N2 or Ar as the phosphine carrier gas.

As for the as-deposited films, some differences can be observed between the films either deposited with $N_2$ or Ar as the carrier gas for phosphine (cf. FIG. 35, FIG. 37 and FIG. 38). The oxygen, nitrogen and carbon concentrations are similar when the phosphorus-Si film is deposited using $N_2$ or Ar as the carrier gas for phosphine. One can however notice that the phosphorus concentration after annealing, as for the as-deposited film, is 10 times lower with the Ar-based film. In addition, the hydrogen concentration is also higher for the film deposited using Ar as the carrier gas. Finally, probably the most significant differences are related to the high peaks observed in the middle of the films for the nitrogen, oxygen and hydrogen profiles.

Binary Phase Diagrams

Figure 39:
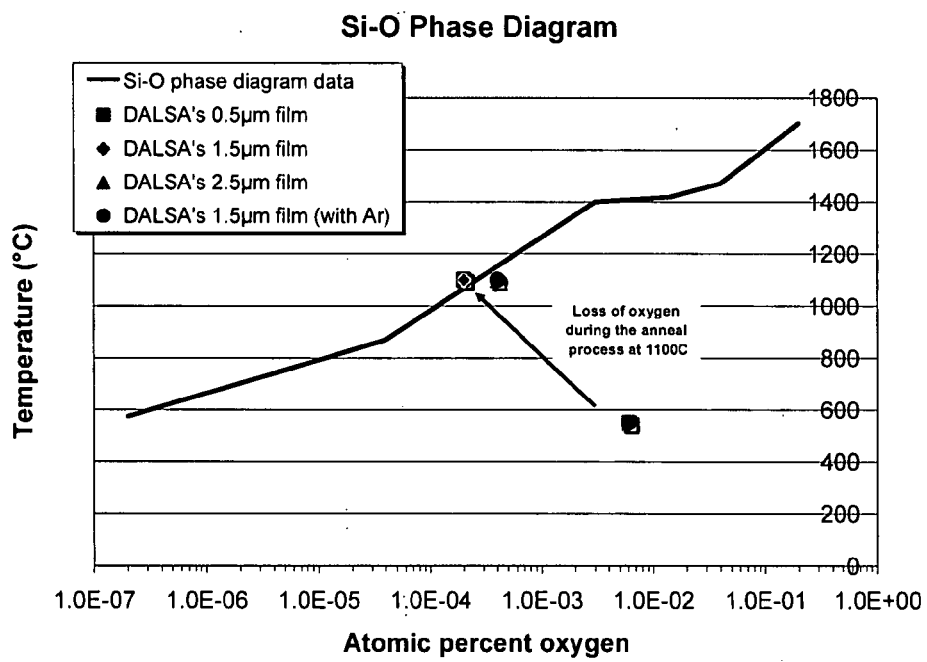
FIG. 39 is an enlargement of the low oxygen atomic concentrations area of the Si—O binary phase diagram along with empiric data gathered prior to and after annealing.
Figure 40:
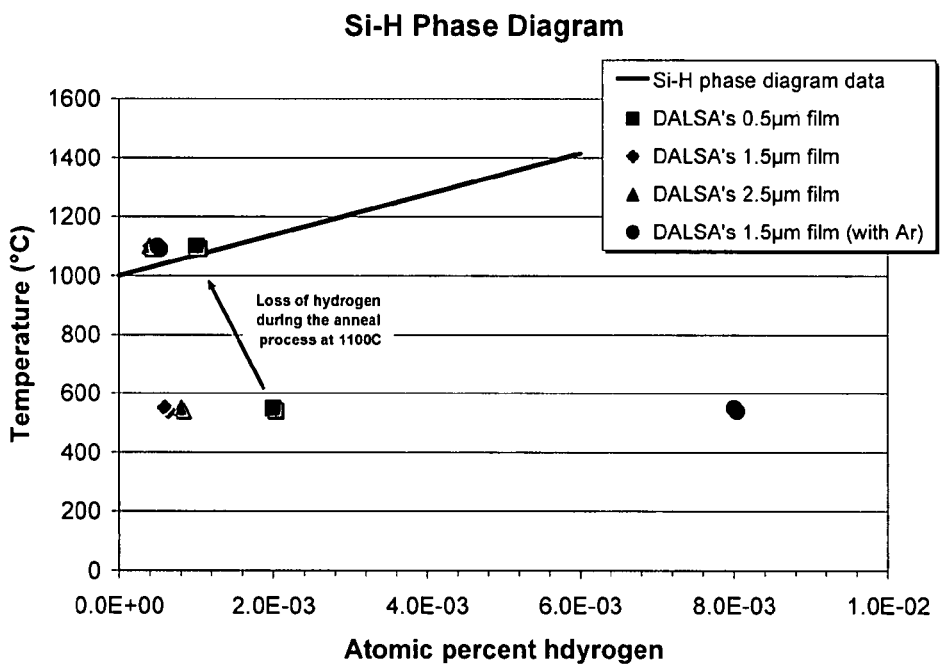
FIG. 40 is an enlargement of the low hydrogen atomic concentrations area of the Si—H binary phase diagram along with empiric data gathered prior to and after annealing.

In order to understand the differences mentioned in the previous Sections, we did plot again the impurities concentrations against the binary phase diagrams for Si—O and Si—H. The results (when using the minimal concentration values measured in the films) are presented in FIG. 39 and FIG. 40. In the case of the Si—O binary phase diagram enlargement presented in FIG. 39, one can observe that the Ar-based film is not behaving differently in terms of oxygen concentrations prior to and after annealing when compared to the $N_2$-based films. On the other hand, the differences mentioned above in Sub-Sections 0 and 0 can be observed in the Si—H binary phase diagram enlargement especially prior to annealing. Such a phase diagram clearly demonstrates that the films deposited with Ar behave differently.

Impact of the Concentration Peaks of Impurities in the Middle of the Film

Si—O System

Figure 41:
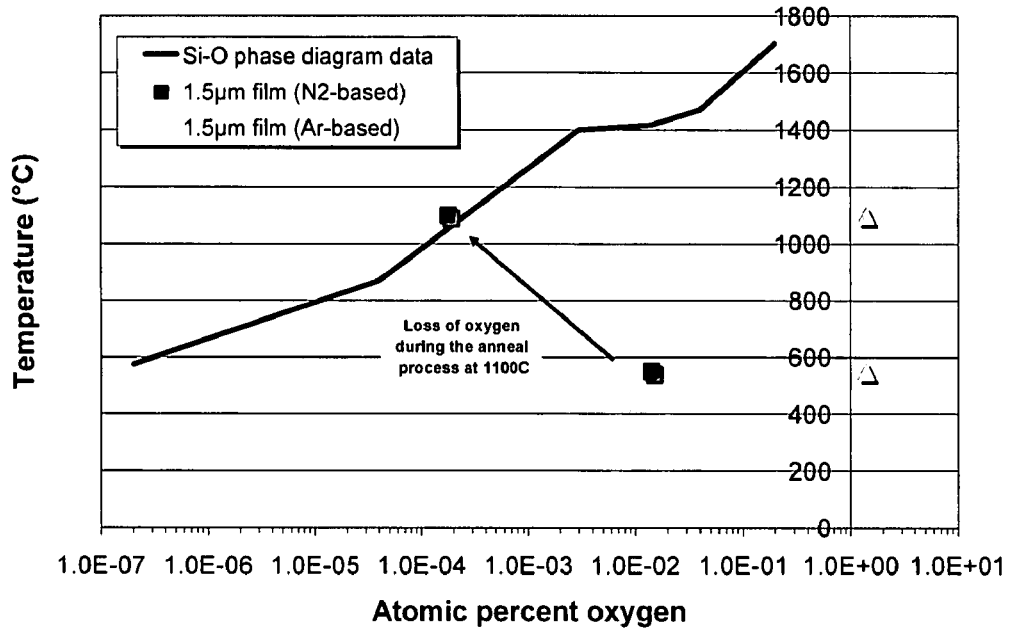
FIG. 41 is an enlargement of the low oxygen atomic concentrations area of the Si—O binary phase diagram along with empiric data gathered prior to and after annealing for the concentration peaks observed on the SIMS profiles in the middle of the films.

As observed in FIG. 41, the oxygen peak concentrations in the middle of the film deposited with nitrogen used as the phosphine carrier gas behave as predicted by the Si—O binary phase diagram. This is shown by the fact that the oxygen concentration will reach the Si—O solubility limit during the annealing process at 1100° C. On the other hand, the concentrations of the oxygen peaks observed for the Ar-based Si film do not display any change in terms of concentrations as opposed to the oxygen base-level concentration for this film.

Si—H system

Figure 42:
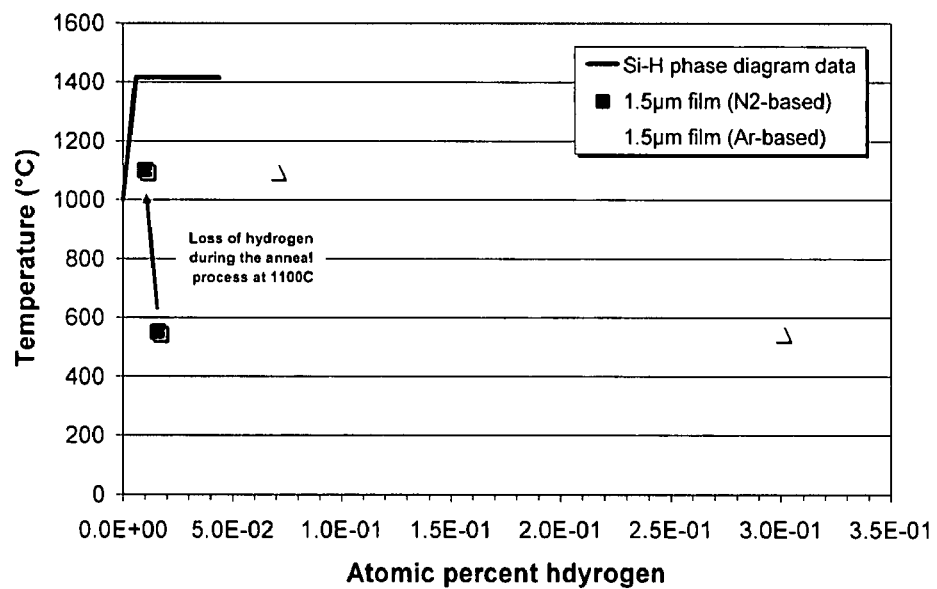
FIG. 42 is an enlargement of the low hydrogen atomic concentrations area of the Si—H binary phase diagram along with empiric data gathered prior to and after annealing for the concentration peaks observed on the SIMS profiles in the middle of the films.

While the hydrogen concentration for the peak of the $N_2$-based Si film is close to the solubility limit of hydrogen in Si, the hydrogen concentration of the film deposited with Ar as the carrier gas for phosphine is still well above the solubility limit (cf FIG. 42) which is still not well understood.

Si—N system

Figure 25:
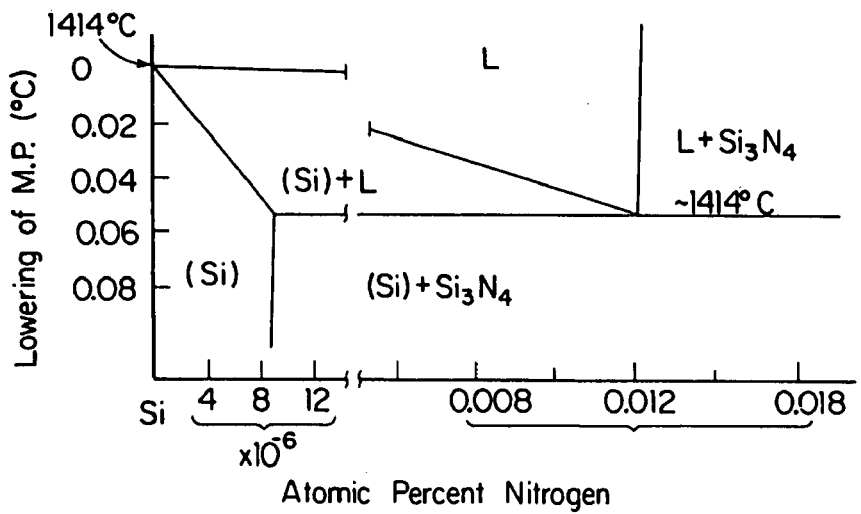
FIG. 25 is an Si—N binary phase diagram (ref. Carlson)

Although the Si—N binary phase diagram presented in FIG. 25 does not predict any change in terms of nitrogen concentration, this element peak concentration in the middle of the film increases by a factor of 600 after the annealing step. Such an increase of the nitrogen concentration for the peak in the middle of the film is still not understood.

Roughness and Grain Size

Figures 43, 44:
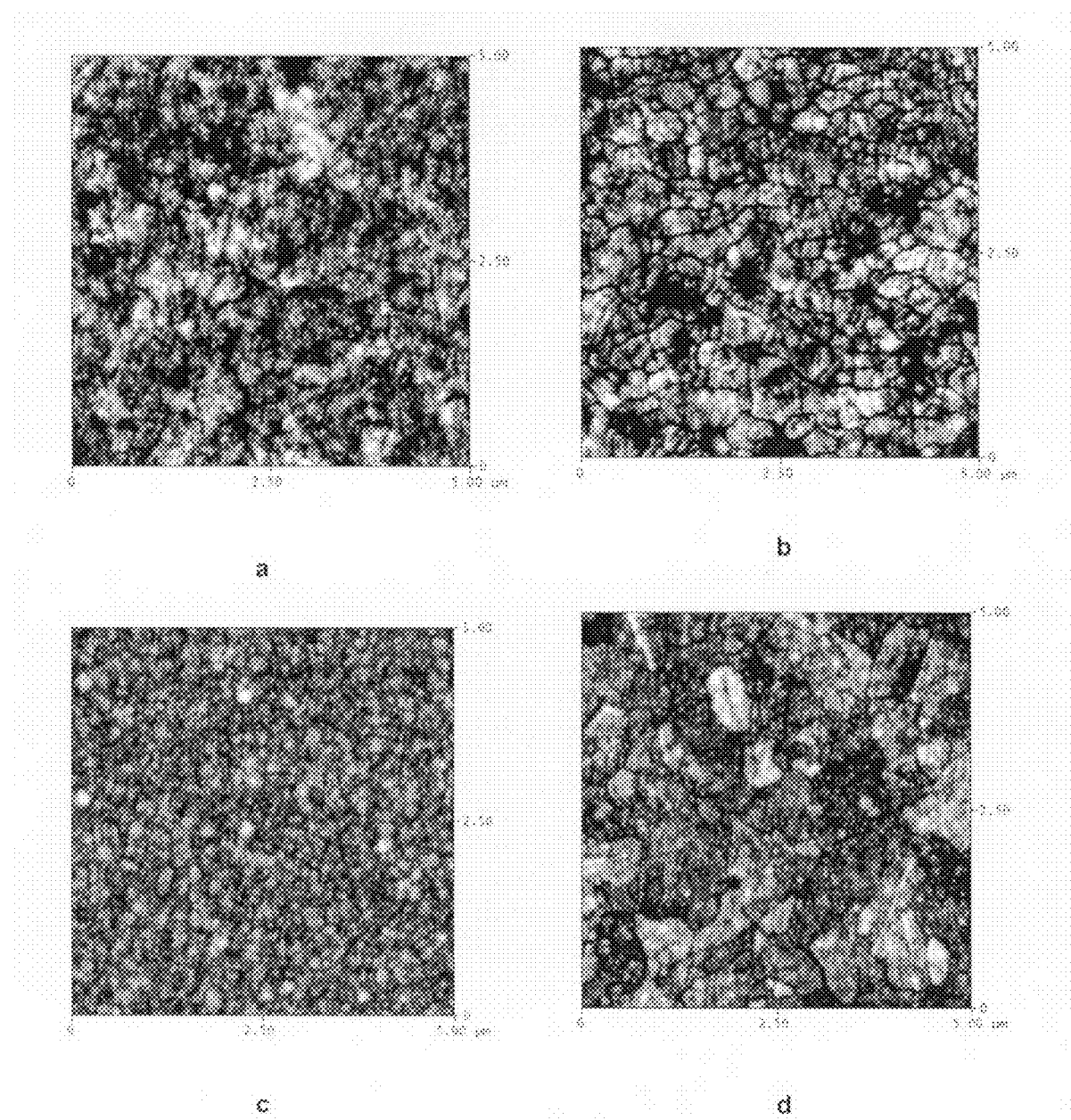
FIG. 43 consists of atomic Force Microscopy images of in-situ doped Si films with a) N2 as the PH3 carrier gas as-deposited, b) N2 as the PH3 carrier gas after annealing at 1100° C., c) Ar as the PH3 carrier gas as deposited and d) Ar as the PH3 carrier gas after annealing at 1100° C.
FIG. 44 consists of atomic Force Microscopy compiled roughness data of in-situ doped Si films deposited with N2 or Ar as the PH3 carrier gas.

The impact of depositing an in-situ doped Si film using Ar as the phosphine carrier gas can also be observed on the film roughness and grain size. The Atomic Force Microscopy (AFM) images and the compiled roughness data shown in FIG. 43 and FIG. 44, respectively demonstrate that the Ar as the phosphine carrier gas has a beneficial impact on the film roughness. Those results show that the Ar-based film is smoother compared to the $N_2$-based film before and after annealing. As for the grain size, we measured grains of 0.3 μm and 0.42 μm on average for the Si film deposited with $N_2$ and Ar as the phosphine carrier gas, respectively. Those results in terms of grain sizes are comparable to the data previously measured with $N_2$ solely for various film thicknesses (cf. Section 0).

Tensile Mechanical Stress

The differences between the $N_2$ and the Ar-based films are not well understood at this point in terms of the concentrations of the peaks in the middle of the film. It however appears that having higher concentrations for the peaks of oxygen, nitrogen and hydrogen for the Ar-based film as opposed to the $N_2$-based film is the main factor leading to the stress differences between a mechanical compressive stress with $N_2$ as the carrier gas compared to a tensile stress with Ar as the phosphine carrier gas despite the fact that the annealing process performed is the same.

Such an impact from the oxygen, nitrogen and hydrogen impurities left in the middle of the film for the Ar-based film can be explained in terms of the atomic radii. As demonstrated by Ouellet et al., the phosphorus atomic radius being smaller than the one of Si will lead to a tensile mechanical stress which will be the case for a phosphorus doped film (cf. FIG. 20). On the other hand, an undoped film will demonstrate compressive stress values.

Figure 45:
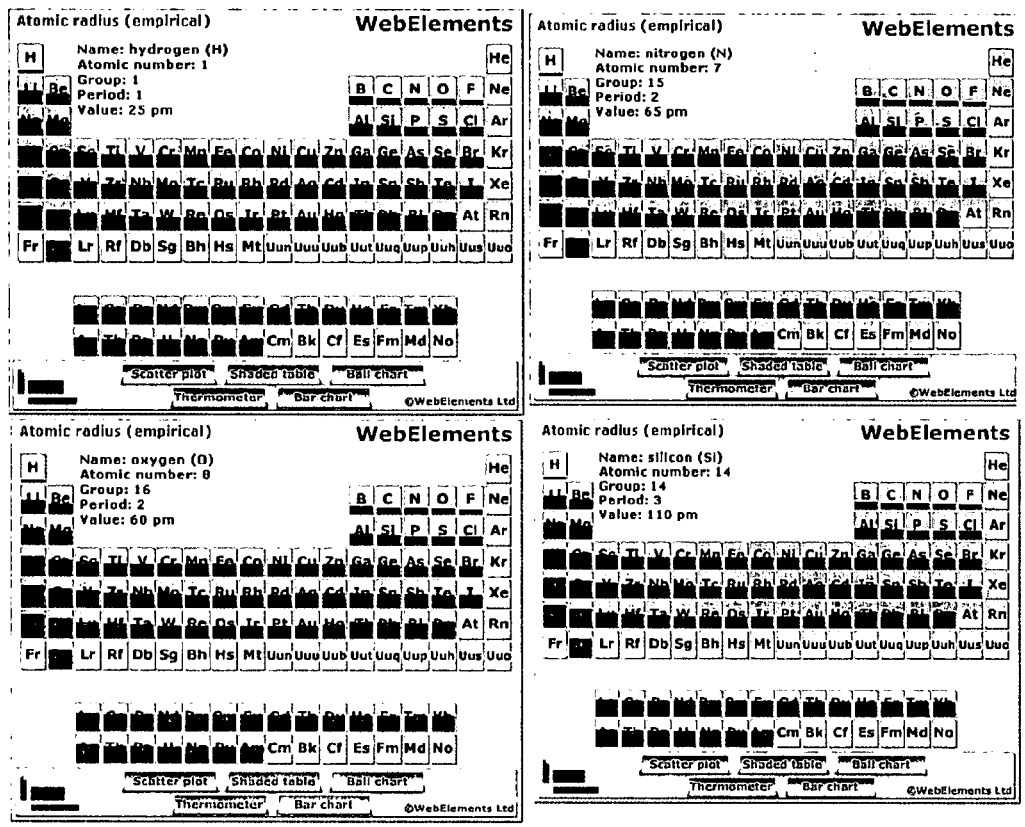
FIG. 45 shows the atomic radii of silicon, nitrogen and oxygen (ref. www.webelements.com)

Our understanding is therefore that the annealing process for the in-situ phosphorus doped film using $N_2$ as the carrier gas will reduce the concentrations of impurities such as oxygen and hydrogen throughout the entire film. On the other hand, using Ar as the phosphine carrier gas will reduce the base-level for those impurities but will also increase the peak values of oxygen, hydrogen and oxygen. As those later impurities all have atomic radii smaller than the one of Si (cf. FIG. 45), having peaks of those elements in the middle of the film will therefore locally increase the mechanical stress of the Si to achieve a local tensile interlayer which will be compensated by the overall compressive stress of the core of the film.

Figure 46:
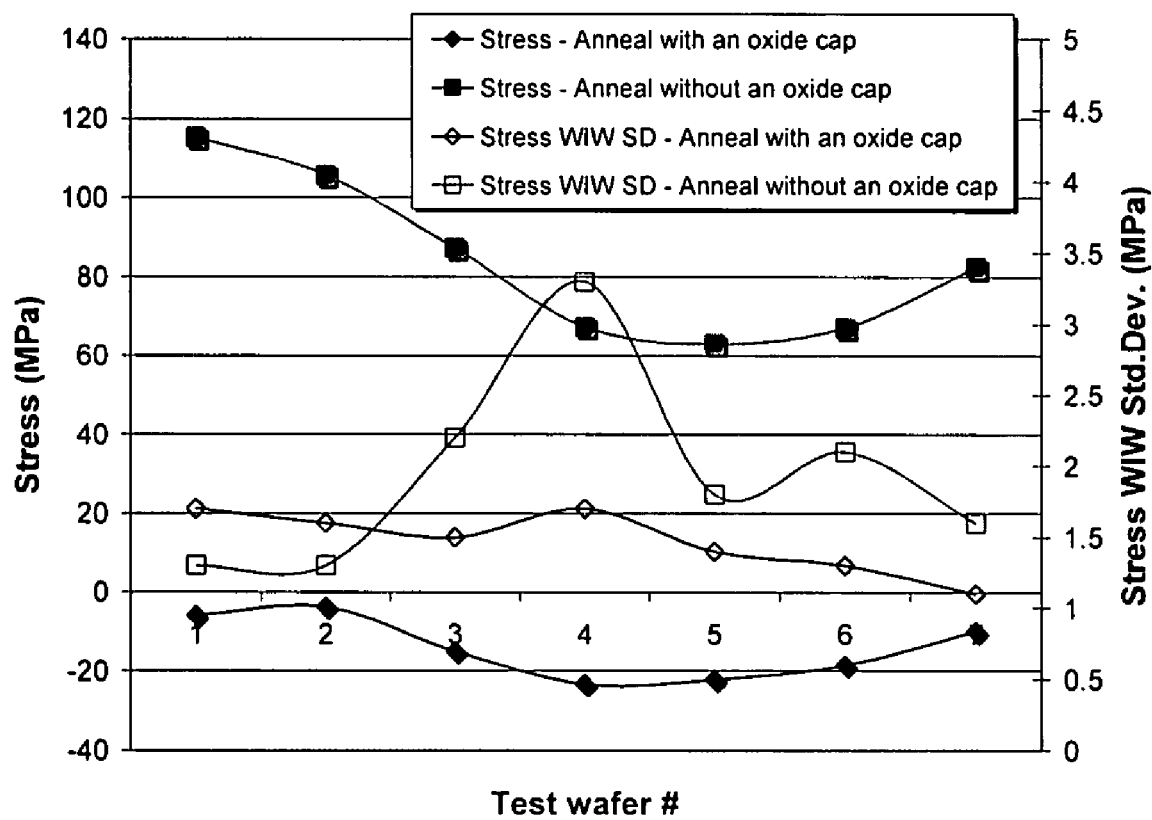
FIG. 46 shows the mechanical stress after annealing for ISDP films deposited with 1% PH3/N2 and annealed at 1100° C. with an oxide cap vs. without an oxide cap.
Figure 47:
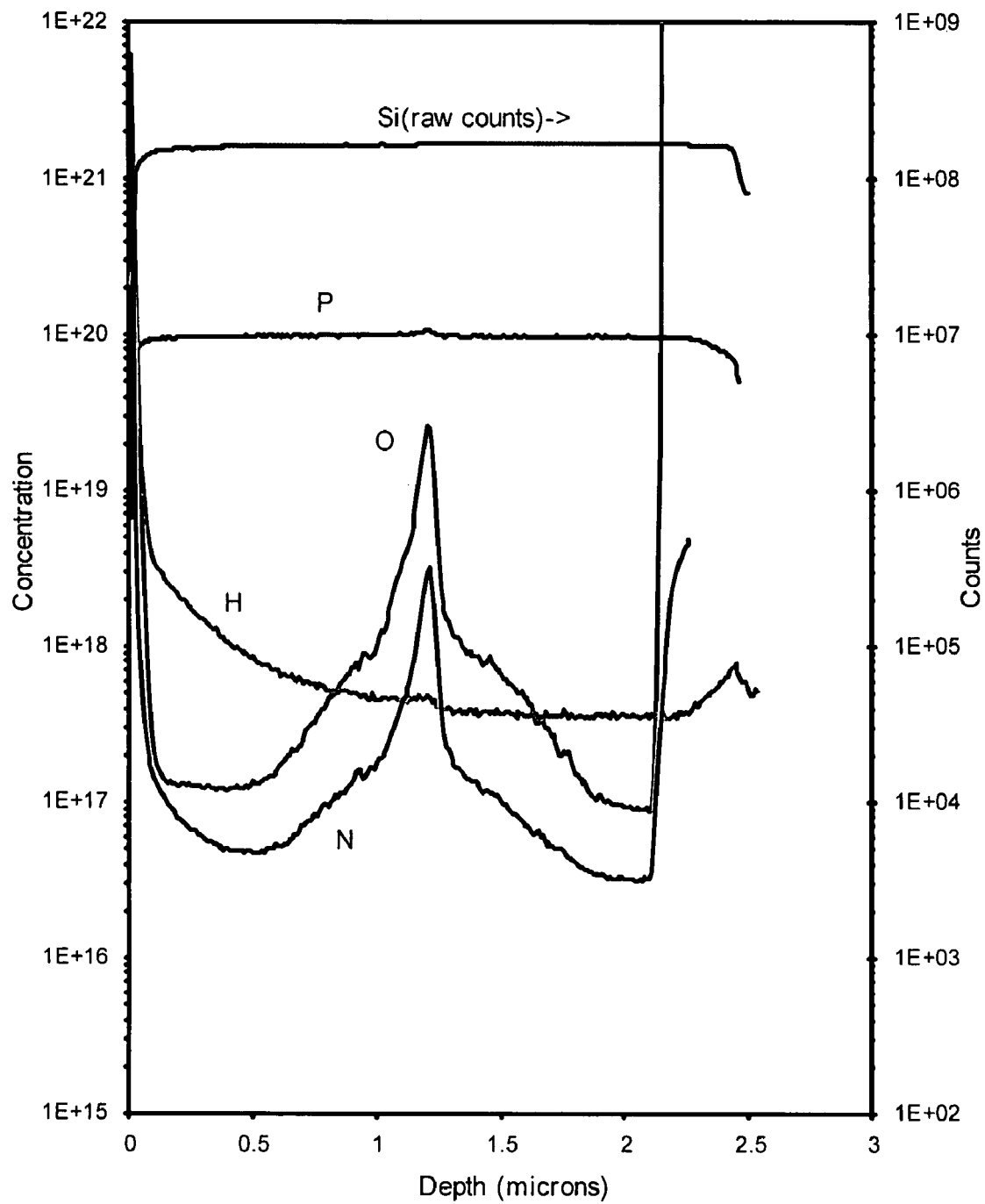
FIG. 47 shows the SIMS profiles for a phosphorus-doped Si film process with N2 as the phosphine carrier gas and annealed at 1100° C. without an oxide cap on the Si layer.

A similar result has also been achieved using nitrogen as the phosphine gas carrier but by modifying the annealing process. In that case, the oxide capping the Si film was not present during the anneal step at 1100° C. as opposed to the method used throughout this study (cf. Section 0). We therefore obtained a tensile film but with large non-uniformities throughout the furnace and within-wafer as demonstrated in FIG. 46. Such poor within-wafer and wafer-to-wafer non-uniformities compared to the Si films deposited with Ar as the phosphine carrier gas can be easily explained by analyzing the SIMS profiles obtained for the Si film processed with $N_2$ as the phosphine carrier gas and annealed without an oxide cap and presented in FIG. 47. The marginal non-uniformities achieved can thus be understood by the wide nitrogen and oxygen peaks in the middle of the film as opposed to the narrow peaks present in the Ar-based Si films. One can however observe the absence of an hydrogen peak in that specific case. This therefore leads us to believe that the only elements allowing us to achieve an overall tensile film due to the peaks are nitrogen and oxygen.

It is therefore possible with the current invention which consists of replacing the nitrogen used as the phosphine carrier gas by argon to accurately control the mechanical stress of the in-situ doped Si film deposited by LPCVD. In addition to the mechanical stress that can be controlled, one could also control the stress gradient. This can be possible as the films tested were processed with a pause in the middle of the deposition process, therefore leading to a balanced film in terms of stress gradient. Moving this pause towards the beginning or the end of the deposition cycle would therefore affect the stress gradient.

The profiles and data in the embodiment disclosed all had a single pause in the middle of the film. However, it follows from the invention that one can control the mechanical stress values from a compressive film when using $N_2$ as the phosphine carrier gas (or Ar as the phosphine gas carrier but without performing a pause during the Si deposition) to highly tensile depending on the number of pauses or the duration of the pause(s) applied during the deposition of the in-situ phosphorus doped Si film processed with Ar as the phosphine carrier gas. Having multiple pauses or a pause with various durations would therefore increase the mechanical stress once again locally at the position in the layer where the pauses were performed but the core of the film would then lower the film stress.

Some variations of the described embodiments are as follows:

i. Although our process in accordance with the preferred embodiment was carried out in a LPCVD batch system, the invention can be applied to a single wafer system.

ii. While in the described embodiments, the "contaminants" (oxygen, hydrogen or other elements or molecules) are introduced in the system through a single pause or multiple pauses during the deposition steps, a possible variation of this invention would be to intentionally add the "contaminants" during the process itself by either stopping the deposition and flowing gases containing the desired "impurities" or contained in any of the precursors such as $SiH_4$ or $PH_3$ or the phosphine carrier gas.

iii. Controlling the initial base pressure prior to the deposition process itself is another way to vary the levels of contaminants in the system and, therefore to modify the film stress and stress gradient accordingly.

iv. In addition to in-situ doped amorphous Si films, such an invention could be carried out with in-situ doped polysilicon films (ISDP).

v. The phosphorus dopant could be replaced by other dopant or dopants (such as $B_2H_6$ for boron or $AsH_3$ for arsenic doping).

vi. In addition, to in-situ doped Si films, the invention could be applied to undoped Si films and lead to similar mechanical film properties although the electrical resistance would be extremely high in such a case.

vii. Ex-situ doped (using diffusion doping or implantation doping) films could also be used to reach similar results.

viii. Although a LPCVD approach was used, other deposition methods such as Chemical Vapor Deposition based (CVD-based such as LPCVD, PECVD, Laser CVD, MOCVD, etc.) approaches could be used to carry out this invention. Any other deposition method which includes but is not limited to Physical Vapor Deposition based (PVD-based such as evaporation or sputtering) could potentially be used to carry out this invention.

ix. Finally, such an invention could be applied to other materials. In this particular case, we focused on Si, but understanding the physics of the effects of "contaminants" and their possible deliberate introductions in processes to alter the mechanical stress or stress gradient could be applied to other structural materials.

This invention can be applied to the manufacture of any Micro-Electro-Mechanical Systems (MEMS) such as micro-gyroscopes, micro-accelerometers, RF micro-resonators, micro-mirrors, micro-motors, micro-actuators and other such micro-devices integrating very sensitive moving mechanical parts.

In addition to MEMS-related applications, this invention could be used for advanced integrated circuits (ex.: CMOS), 3D semiconductors or any other type of micro-machining applications.

We claim:

1. A method of fabricating a structural silicon film in MEMS or NEMS devices, comprising:
depositing said silicon film using an $SiH_4$-based precursor gas in the presence of phosphine as a dopant and argon as a carrier gas by LPCVD at a deposition temperature less than 580° C.; and
wherein the deposited silicon film has a tensile stress.

2. A method as claimed in claim 1, wherein the silicon is deposited by an in-situ doped process.

3. A method as claimed in claim 1, wherein the silicon film is deposited as amorphous silicon.

4. A method as claimed in claim 1, wherein the silicon is deposited in a batch deposition system.

5. A method as claimed in claim 1, wherein the silicon film is an amorphous film deposited in a horizontal LPCVD furnace under the following deposition conditions:
high purity precursors: $SiH_4$ at a partial pressure of 744 mTorr and 1% Ar at a partial pressure of 106 mTorr;
deposition pressure <1000 mTorr;
20 minute pause during deposition cycle:
point-of-use gas purifiers for $SiH_4$ and PH3/Ar.

6. A method as claimed in claim 1, wherein at least one deliberate pause is implemented during the deposition of the silicon film to deliberately introduce impurities locally.

7. A method as claimed in claim 6, wherein multiple pauses are implemented during the deposition of the silicon film.

8. A method as claimed in claim 6, wherein said at least one pause is implemented during the deposition of the film, and the silicon film is subsequently annealed to modify the stress gradient.

9. A method as claimed in claim 1, wherein the deposited film is subsequently subjected to an anneal step to modify the mechanical stress values of the silicon film.

* * * * *